(12) United States Patent
Arita et al.

(10) Patent No.: US 7,488,668 B2
(45) Date of Patent: Feb. 10, 2009

(54) MANUFACTURING METHOD FOR SEMICONDUCTOR DEVICES, ARRANGEMENT DETERMINATION METHOD AND APPARATUS FOR SEMICONDUCTOR DEVICE FORMATION REGIONS, AND PROGRAM FOR DETERMINING ARRANGEMENT OF SEMICONDUCTOR DEVICE FORMATION REGIONS

(75) Inventors: Kiyoshi Arita, Fukuoka-ken (JP); Hiroshi Haji, Fukuoka-ken (JP); Kazuhiro Noda, Fukuoka-ken (JP); Akira Nakagawa, Saga-ken (JP); Teruaki Nishinaka, Saga-ken (JP)

(73) Assignee: Panasonic Corporation, Osaka (JP)

( * ) Notice: Subject to any disclaimer, the term of this patent is extended or adjusted under 35 U.S.C. 154(b) by 722 days.

(21) Appl. No.: 11/183,739

(22) Filed: Jul. 19, 2005

(65) Prior Publication Data
US 2006/0019416 A1 Jan. 26, 2006

(30) Foreign Application Priority Data
Jul. 23, 2004 (JP) ............................. 2004-215364

(51) Int. Cl.
*H01L 21/00* (2006.01)
*H01L 23/544* (2006.01)
(52) U.S. Cl. .................... 438/460; 438/14; 257/620; 257/E21.599; 257/E23.179
(58) Field of Classification Search ................. 438/460; 257/620
See application file for complete search history.

(56) References Cited

U.S. PATENT DOCUMENTS
6,528,864 B1   3/2003   Arai

FOREIGN PATENT DOCUMENTS

| EP | 0 709 740 | 5/1996 |
| JP | 59-220947 | 12/1984 |
| JP | 11-176944 | 7/1999 |
| JP | 2001-15455 | 1/2001 |
| JP | 2001-230181 | 8/2001 |
| JP | 2003-257843 | 9/2003 |

OTHER PUBLICATIONS

Chien C-F, et al., entitled "*A Cutting Algorithm for Optimizing the Wafer Exposure Pattern*", IEEE Transactions on Semiconductor Manufacturing, IEEE Inc., New York, US, vol. 14, No. 2, May 2001, pp. 157-162, XP001081178.

*Primary Examiner*—David A Zarneke
(74) *Attorney, Agent, or Firm*—Wenderoth, Lind & Ponack, L.L.P.

(57) ABSTRACT

With use of a length-dimension of a second-line-segment of a unit-device-formation-region as an arrangement interval, a plurality of parallel lines are disposed in a device-formation-effective-region on a wafer so as to form a plurality of parallel-line-partition-regions, the unit-device-formation-regions are arranged in each of the parallel-line-partition-regions independently of and separately from other parallel-line-partition-regions so that the acquisition number of the unit-device-formation-regions is maximized, and an arrangement of the respective unit-device-formation-regions in the respective parallel-line-partition-regions is determined as an arrangement of the entire device-formation-effective-region.

24 Claims, 20 Drawing Sheets

US 7,488,668 B2

MANUFACTURING METHOD FOR SEMICONDUCTOR DEVICES, ARRANGEMENT DETERMINATION METHOD AND APPARATUS FOR SEMICONDUCTOR DEVICE FORMATION REGIONS, AND PROGRAM FOR DETERMINING ARRANGEMENT OF SEMICONDUCTOR DEVICE FORMATION REGIONS

BACKGROUND OF THE INVENTION

The present invention relates to an arrangement determination method and apparatus for semiconductor device formation regions for determining the arrangement of a plurality of unit-device-formation-regions that are the rectangular regions to form semiconductor devices in a device-formation-effective-region on a semiconductor wafer, an arrangement determination program capable of performing such an arrangement determination method, as well as a manufacturing method for semiconductor devices for manufacturing semiconductor devices with use of the arrangement determination method.

As such an arrangement determination method for regions in which semiconductor chips (devices) in an almost rectangular shape are formed on a semiconductor wafer, various methods have conventionally been known (see, i.e., Japanese Unexamined Patent Publications No. H11-176944 A, No. 2001-15455 A, No. 2001-230181 A, and No. 2003-257843 A). In these arrangement determination methods for semiconductor chip formation regions, the semiconductor chip formation regions that are almost-rectangular shaped regions are obtained to the fullest extent from an almost-round-shaped semiconductor wafer having a limited size so as to increase efficiency in semiconductor chip production and to reduce chip production costs.

SUMMARY OF THE INVENTION

The conventional arrangement determination methods for semiconductor chip formation regions are composed of the steps of disposing a plurality of dicing lines in directions along the surface of the semiconductor wafer and orthogonal to each other in lattice-like patterns so as to obtain the regions enclosed by these dicing lines as semiconductor chip formation regions, and determining an optimum arrangement of these semiconductor chip formation regions. More particularly, in the semiconductor wafer, the arrangement of these semiconductor chip formation regions is determined so as to obtain as many semiconductor chips as possible on the premise that the semiconductor chip formation regions are arranged in a grid.

However, due to constraints on the arrangement patterns to be in a grid, in a lattice-like pattern or the like, the acquisition number of the semiconductor chips is limited, which causes a problem that even though unutilized regions remain in the vicinity of the peripheral portions of the semiconductor wafer, semiconductor chips cannot be obtained any more effectively.

An object of the present invention is to provide, for solving the above problem, arrangement determination method and apparatus for semiconductor device formation regions, which are capable of maximizing the acquisition number of semiconductor devices per semiconductor wafer in arrangement determination of semiconductor device formation regions for determining the arrangement of a plurality of unit-device-formation-regions that are rectangular regions for forming semiconductor devices in a device-formation-effective-region on a semiconductor wafer, an arrangement determination program capable of performing such an arrangement determination method, and a manufacturing method for semiconductor devices for manufacturing semiconductor devices with use of the arrangement determination method.

In order to accomplish the object, the present invention is constituted as follows.

According to a first aspect of the present invention, there is provided a manufacturing method for semiconductor devices, which is a method for determining an arrangement of a plurality of unit-device-formation-regions that are rectangular regions for forming the semiconductor devices in a device-formation-effective-region on a semiconductor wafer and manufacturing the semiconductor devices on basis of the determined arrangement, comprising:

forming a plurality of parallel-line-partition-regions partitioned by an outer periphery of the device-formation-effective-region on the wafer and a plurality of parallel lines, by disposing the respective parallel lines in the device-formation-effective-region on the wafer with use of a length-dimension of a second-line-segment out of a first-line-segment and the second-line-segment which constitute the unit-device-formation-region and are orthogonal to each other as an arrangement interval, through execution of computer processing;

forming one or a plurality of the unit-device-formation-regions partitioned by the respective parallel lines and a plurality of the second-line-segments in the parallel-line-partition-regions, by disposing the respective second-line-segments in a direction orthogonal to the parallel lines in the respective parallel-line-partition-regions with use of a length-dimension of the first-line-segment as an arrangement interval, through execution of computer processing;

determining an arrangement of the unit-device-formation-regions which maximizes each number of the unit-device-formation-regions formed in each of the respective parallel-line-partition-regions independently of other parallel-line-partition-regions as an arrangement of the respective unit-device-formation-regions in the entire device-formation-effective-region on the wafer, through execution of computer processing, and thereby preparing the determined arrangement as an arrangement information for the unit-device-formation-regions;

forming the respective semiconductor devices on the semiconductor wafer on basis of the prepared arrangement information; and performing plasma etching process to the semiconductor wafer with a mask disposed thereon from a masked surface to divide the semiconductor wafer into the respective semiconductor devices in accordance with the arrangement information, thereby the respective divided semiconductor devices are manufactured.

According to a second aspect of the present invention, there is provided the manufacturing method for semiconductor devices as defined in the first aspect, wherein region information for the unit-device-formation-regions and the device-formation-effective-region are inputted into a computer, then the respective computer processing is executed with use of the inputted region information, and thereby the arrangement information for the unit-device-formation-regions is prepared.

According to a third aspect of the present invention, there is provided the manufacturing method for semiconductor devices as defined in the first aspect, further comprising:

after forming the semiconductor devices, defining dividing lines for dividing the wafer into the respective separate semiconductor devices on basis of the prepared arrangement information of the unit-device-formation-regions on the masked surface of the wafer with disposing the mask thereon, wherein by performing plasma etching processing, the wafer is divided into the respective separate semiconductor devices in accordance with the defined dividing lines.

According to a fourth aspect of the present invention, there is provided the manufacturing method for semiconductor devices as defined in the first aspect, wherein in the determining the arrangement of the unit-device-formation-regions, an arrangement of the respective parallel lines in the device-formation-effective-region is determined so as to maximize a total number of the unit-device-formation-regions in the respective parallel-line-partition-regions.

According to a fifth aspect of the present invention, there is provided the manufacturing method for semiconductor devices as defined in the fourth aspect, wherein in the determining an arrangement of the unit-device-formation-regions, the disposed parallel lines are rearranged with an offset arrangement, then a total number of the respective unit-device-formation-regions with the rearrangement are calculated, and then an arrangement of the respective unit-device-formation-regions with the arrangement of the respective parallel lines which maximizes the total number is determined as an arrangement of the respective unit-device-formation-regions in the entire device-formation-effective-region.

According to a sixth aspect of the present invention, there is provided the manufacturing method for semiconductor devices as defined in the first aspect, wherein in the case where the semiconductor wafer has an orientation flat, and the device-formation-effective-region has a linear portion corresponding to the orientation flat, the respective parallel lines are disposed in parallel with the linear portion.

According to a seventh aspect of the present invention, there is provided the manufacturing method for semiconductor devices as defined in the first aspect, wherein the respective unit-device-formation-regions are regions having an identical dimensions and shape determined on basis of dimensions and shape of the semiconductor devices and a line width-dimension of dividing lines for dividing the respective semiconductor devices from the semiconductor wafer.

According to an eighth aspect of the present invention, there is provided the manufacturing method for semiconductor devices as defined in the first aspect, wherein a maximum value of formation number of the unit-device-formation-regions in the respective parallel-line-partition-regions is an integer number given by dividing a length-dimension of a shorter line among two parallel lines forming the parallel-line-partition-region by the length-dimension of the first segment.

According to a ninth aspect of the present invention, there is provided the manufacturing method for semiconductor devices as defined in the first aspect, wherein in the determined arrangement of the unit-device-formation-regions, the parallel-line-partition-regions formed to incorporate an odd number of the respective unit-device-formation-regions and the parallel-line-partition-regions formed to incorporate an even number thereof are present in a mixed state.

According to a tenth aspect of the present invention, there is provided the manufacturing method for semiconductor devices as defined in the first aspect, wherein in the determining the arrangement of the unit-device-formation-regions, centering is performed on the arrangement of the respective unit-device-formation-regions in the respective parallel-line-partition-regions with a center position of the parallel-line-partition-regions in a direction along the pertinent parallel lines as a reference.

According to an eleventh aspect of the present invention, there is provided the manufacturing method for semiconductor devices as defined in the first aspect, further comprising:

after performing the plasma etching process, performing ashing process to the masked surface so as to remove the respective masks on the respective divided semiconductor devices.

According to a twelfth aspect of the present invention, there is provided an arrangement determination method for semiconductor device formation regions, which is a method for determining arrangement of a plurality of unit-device-formation-regions that are rectangular regions for forming semiconductor devices in a device-formation-effective-region on a semiconductor wafer, the method comprising:

forming a plurality of parallel-line-partition-regions partitioned by an outer periphery of the device-formation-effective-region on the wafer and a plurality of parallel lines, by disposing the respective parallel lines in the device-formation-effective-region on the wafer with use of a length-dimension of a second-line-segment out of a first-line-segment and the second-line-segment which constitute the unit-device-formation-region and are orthogonal to each other as an arrangement interval, through execution of computer processing;

forming one or a plurality of the unit-device-formation-regions partitioned by the respective parallel lines and a plurality of the second-line-segments in the parallel-line-partition-regions, by disposing the respective second-line-segments in a direction orthogonal to the parallel lines in the respective parallel-line-partition-regions with use of a length-dimension of the first-line-segment as an arrangement interval, through execution of computer processing; and determining an arrangement of the unit-device-formation-regions which maximizes each number of the unit-device-formation-regions formed in each of the respective parallel-line-partition-regions independently of other parallel-line-partition-regions as an arrangement of the respective unit-device-formation-regions in the entire device-formation-effective-region, through execution of computer processing.

According to a thirteenth aspect of the present invention, there is provided the arrangement determination method for semiconductor device formation regions as defined in the twelfth aspect, wherein region information for the unit-device-formation-regions and the device-formation-effective-region are inputted into a computer, then the respective computer processing is executed with use of the inputted region information, and thereby the determined arrangement is prepared as arrangement information for the unit-device-formation-regions.

Moreover, such an arrangement determination method for semiconductor device formation regions is performed by an arrangement determination apparatus including a storage unit for storing region information on a device-formation-effective-region in a semiconductor wafer and on unit-device-formation-regions that are rectangular regions to form semiconductor devices, and a processing unit for performing processing to determine an arrangement of a plurality of the unit-device-formation-regions within the device-formation-effective-region based on the pertinent respective region information, in which the processing unit which has function to read the respective region information stored in the storage unit and to perform each of the procedures in sequence based on the respective read region information.

Moreover, such an arrangement determination apparatus may be typified by a computer, and the arrangement determination method may be an arrangement determination method for semiconductor device formation regions performed by using the computer.

Moreover, the information on the determined arrangement of the unit-device-formation-regions may be stored in the storage unit by the processing unit.

According to a fourteenth aspect of the present invention, there is provided the arrangement determination method for semiconductor device formation regions as defined in the twelfth aspect, wherein in the determining an arrangement of the unit-device-formation-regions, an arrangement of the respective parallel lines in the device-formation-effective-region is determined so as to maximize a total number of the unit-device-formation-regions in the respective parallel-line-partition-regions.

According to a fifteenth aspect of the present invention, there is provided the arrangement determination method for semiconductor device formation regions as defined in the fourteenth aspect, wherein in the determining an arrangement of the unit-device-formation-regions, the disposed parallel lines are rearranged with an offset arrangement, then a total number of the respective unit-device-formation-regions with the rearrangement are calculated, and then an arrangement of the respective unit-device-formation-regions with the arrangement of the respective parallel lines which maximizes the total number is determined as an arrangement of the respective unit-device-formation-regions in the entire device-formation-effective-region.

According to a sixteenth aspect of the present invention, there is provided the arrangement determination method for semiconductor device formation regions as defined in the twelfth aspect, wherein in the case where the semiconductor wafer has an orientation flat, and the device-formation-effective-region has a linear portion corresponding to the orientation flat, the respective parallel lines are disposed in parallel with the linear portion.

According to a seventeenth aspect of the present invention, there is provided the arrangement determination method for semiconductor device formation regions as defined in the twelfth aspect, wherein the respective unit-device-formation-regions are regions having an identical dimensions and shape determined on basis of dimensions and shape of the semiconductor devices and a line width-dimension of dividing lines for dividing the respective semiconductor devices from the semiconductor wafer.

According to an eighteenth aspect of the present invention, there is provided the arrangement determination method for semiconductor device formation regions as defined in the twelfth aspect, wherein a maximum value of formation number of the unit-device-formation-regions in the respective parallel-line-partition-regions is an integer number given by dividing a length-dimension of a shorter line among two parallel lines forming the parallel-line-partition-region by the length-dimension of the first segment.

According to a nineteenth aspect of the present invention, there is provided the arrangement determination method for semiconductor device formation regions as defined in the twelfth aspect, wherein in the device-formation-effective-region, the parallel-line-partition-regions formed to incorporate an odd number of the respective unit-device-formation-regions and the parallel-line-partition-regions formed to incorporate an even number thereof are present in a mixed state.

According to a 20th aspect of the present invention, there is provided the arrangement determination method for semiconductor device formation regions as defined in the twelfth aspect, wherein in the determining the arrangement of the unit-device-formation-regions, centering is performed on the arrangement of the respective unit-device-formation-regions in the respective parallel-line-partition-regions with a center position of the parallel-line-partition-regions in a direction along the pertinent parallel lines as a reference.

According to a 21st aspect of the present invention, there is provided the arrangement determination method for semiconductor device formation regions as defined in the twelfth aspect aspect, which is a method for determining arrangement of the respective unit-device-formation-regions in the semiconductor wafer which is divided into the respective separate semiconductor devices with applying plasma etching process.

According to a 22nd aspect of the present invention, there is provided an arrangement determination apparatus for semiconductor device formation regions for determining arrangement of a plurality of unit-device-formation-regions that are rectangular regions for forming semiconductor devices in a device-formation-effective-region on a semiconductor wafer, comprising:

a parallel-line-partition-region forming processing unit for forming a plurality of parallel-line-partition-regions partitioned by an outer periphery of the device-formation-effective-region on the wafer and a plurality of respective parallel lines, by disposing the respective parallel lines in the device-formation-effective-region with use of a length-dimension of a second-line-segment out of a first-line-segment and the second-line-segment which constitute the unit-device-formation-region and are orthogonal to each other as an arrangement interval;

an unit-device-formation-region forming processing unit for forming one or a plurality of the unit-device-formation-regions partitioned by the respective parallel lines and a plurality of the respective second-line-segments in the parallel-line-partition-regions formed by the parallel-line-partition-region forming processing unit, by disposing the respective second-line-segments in a direction orthogonal to the parallel lines in the respective parallel-line-partition-regions with use of a length-dimension of the first-line-segment as an arrangement interval; and an unit-device-formation-region arrangement determining processing unit for determining an arrangement of the unit-device-formation-regions which maximizes each number of the unit-device-formation-regions formed by the unit-device-formation-region forming processing unit in each of the respective parallel-line-partition-regions independently of other parallel-line-partition-regions as an arrangement of the respective unit-device-formation-regions in the entire device-formation-effective-region.

Moreover, such an arrangement determination apparatus for semiconductor device formation regions includes a storage unit for storing region information on a device-formation-effective-region in a semiconductor wafer and on unit-device-formation-regions that are rectangular regions to form semiconductor devices, and a processing unit having the parallel-line-partition-region formation means, the unit-device-formation-region formation means and the unit-device-formation-regions arrangement determination means for performing processing to determine arrangement of a plurality of the unit-device-formation-regions within the device-formation-effective-region by using pertinent respective means based on the respective region information stored in the storage unit.

According to a 23rd aspect of the present invention, there is provided a program for determining arrangement of semiconductor device formation regions, which makes a computer execute procedures for determining arrangement of a plurality of unit-device-formation-regions which are rectangular regions for forming semiconductor devices in a device-formation-effective-region on a semiconductor wafer, the procedures comprising:

a first procedure for forming a plurality of parallel-line-partition-regions partitioned by an outer periphery of the device-formation-effective-region and a plurality of parallel lines, by disposing the respective parallel lines in the device-formation-effective-region with use of a length-dimension of a second-line-segment out of a first-line-segment and the second-line-segment which constitute the unit-device-formation-region and are orthogonal to each other as an arrangement interval;

a second procedure for forming one or a plurality of the unit-device-formation-regions partitioned by the respective parallel lines and a plurality of second-line-segments in the parallel-line-partition-regions, by disposing the respective second-line-segments in a direction orthogonal to the parallel lines in the respective parallel-line-partition-regions formed by the first procedure with use of a length-dimension of the first-line-segment as an arrangement interval; and a third procedure for determining an arrangement of the unit-device-formation-regions which maximizes each number of the unit-device-formation-regions formed by the second procedure in each of the respective parallel-line-partition-regions independently of other parallel-line-partition-regions as an arrangement of the respective unit-device-formation-regions in the entire device-formation-effective-region.

According to a 24th aspect of the present invention, there is provided the program for determining arrangement of the semiconductor device formation regions as defined in the 23rd aspect, further comprising:

a fourth procedure for calculating total number of the respective unit-device-formation-regions in the respective parallel-line-partition-regions obtained by conduction of the third procedure and determining an arrangement of the respective parallel lines in the entire device-formation-effective-region which maximizes the total number.

According to the aspects of the present invention, through execution of computer processing, by disposing a plurality of parallel lines with a length-dimension of a second-line-segment of a unit-device-formation-region as an arrangement interval in a device-formation-effective-region in a semiconductor wafer, a plurality of parallel-line-partition-regions are formed, the unit-device-formation-regions are arranged in the respective parallel-line-partition-regions independently of and separately from other parallel-line-partition-regions so that the acquisition number of the unit-device-formation-regions are maximized, and the arrangement of the respective unit-device-formation-regions in the respective parallel-line-partition-regions is determined as the arrangement in the entire device-formation-effective-region, by which an unused region in the respective parallel-line-partition-regions may be reduced compared to the arrangement determined by conventional methods limited to the arrangement in a grid, and an effective arrangement of the unit-device-formation-regions in the device-formation-effective-region may be achieved. Therefore, it becomes possible to realize a specific arrangement determination method capable of increasing semiconductor chip formation number per a semiconductor wafer.

Furthermore, an arrangement of the respective parallel line is varied (shifted) with, for example, an offset arrangement and determined so as to maximize the total acquisition number of the unit-device-formation-regions in the respective parallel-line-partition-regions, by which effective utilization in the device-formation-effective-region may be further enhanced.

Further, in the arrangement determined by such a method, the parallel-line-partition-regions having an odd number of the unit-device-formation-regions to be formed and the parallel-line-partition-regions having an even number of the unit-device-formation-regions to be formed are present in a mixed state, and the respective unit-device-formation-regions are not arranged in a matrix state in the device-formation-effective-region, which makes it difficult to apply a mechanical cutting means as a means to dice a semiconductor wafer, on which respective semiconductor devices being formed based on such an arrangement, into the separate semiconductor devices. However, by applying dicing not by the mechanical cutting means but by plasma etching, reliable dicing may be achieved. More particularly, application of the plasma etching makes it possible to provide a method for determining the arrangement of the respective unit-device-formation-regions in the semiconductor wafer which is diced into the semiconductor devices as well as to provide a manufacturing method for semiconductor devices with use of such an arrangement determination method.

Moreover, such an arrangement determination method for semiconductor device formation regions may be provided as an arrangement determination program for semiconductor device formation regions for executing a first procedure of forming a plurality of the parallel-line-partition-regions, a second procedure of forming the unit-device-formation-regions in the respective parallel-line-partition-regions, and a third procedure of determining an arrangement of the unit-device-formation-regions which maximizes the acquisition number of the unit-device-formation-regions in the respective parallel-line-partition-regions independently of other parallel-line-partition-regions and finalizing the determined arrangement as an arrangement in the entire device-formation-effective-region.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
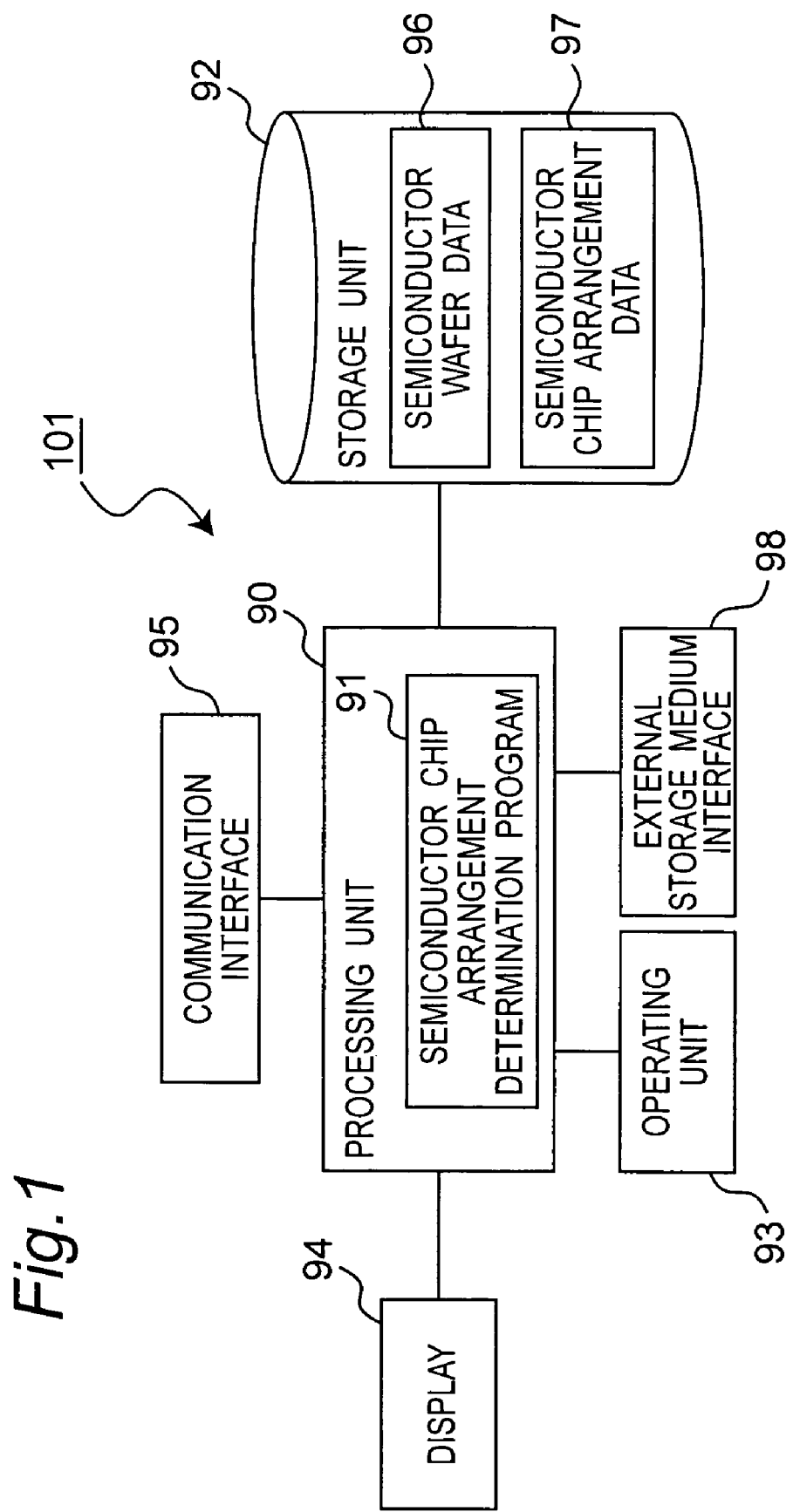
FIG. 1 is a block diagram showing a configuration of a semiconductor chip arrangement determination apparatus according to an embodiment of the present invention.

Before the description of the present invention proceeds, it is to be noted that like parts are designated by like reference numerals throughout the accompanying drawings.

The embodiment of the present invention will be hereinbelow described in detail with reference to the drawings.

FIG. 1 is a block diagram showing an outlined configuration of a semiconductor chip arrangement determination apparatus 101 exemplifying an arrangement determination apparatus for semiconductor device formation regions according to an embodiment of the present invention. With reference to FIG. 1, description will be hereinbelow given of the outlined configuration of the semiconductor chip arrangement determination apparatus 101.

As shown in FIG. 1, the semiconductor chip arrangement determination apparatus 101 has a processing unit 90 for executing a semiconductor chip (semiconductor device) arrangement determination program 91 to perform arrangement determination processing for the semiconductor chips. The processing unit 90 has a CPU, a ROM, a RAM and the like, which are not shown, and the semiconductor chip arrangement determination program 91 is, for example, stored in the ROM and the processing is carried out by the CPU reading and executing the program 91. Moreover, the results of operations performed during the processing are temporarily stored in the RAM or the stored information is read by the CPU.

Further, the semiconductor chip arrangement determination apparatus 101 has a storage unit 92 for readably storing various information regarding the semiconductor chip arrangement determination processing, an operating unit 93 allowing execution of operation such as inputting information into the storage unit 92 and the processing operations, and a display 94 for visibly displaying the processing results and inputted information. These storage unit 92, operating unit 93 and display 94 are connected to the processing unit 90, which allows the information inputted from the operating unit 93 to be stored onto the storage unit 92 by the processing unit 90 and the information stored in the storage unit 92 to be displayed in the display 94 by the processing unit 90.

Moreover, the semiconductor chip arrangement determination apparatus 101 has some component units which allow data exchange with the outside of the apparatus, e.g., a communication interface 95 for performing data exchange by means of communication and the like, and an external storage medium interface 98 for performing data exchange with use of a storage medium using magnetism, light and the like. It is to be understood that the semiconductor chip arrangement determination program 91 is not limited to those stored in the ROM in the processing unit 90, but may include those stored in a storage medium (such as optical disks, etc.) and inputted through the external storage interface 98 at the time of execution of the processing.

Moreover, the information stored in the storage unit 92 includes, for example, parameter information necessary for the processing unit 90 to execute the semiconductor chip arrangement determination program 91, the parameter information including semiconductor wafer data 96 that is information regarding the shape of a semiconductor wafer, the shape of a semiconductor chip and the like and semiconductor chip arrangement data (information) 97 that is information regarding an arrangement of the semiconductor chips formed by the processing unit 90 executing the program 91. It is to be noted that the information stored in the storage unit 92 is not limited to those sets of data but other various sets of information are stored where necessary.

Figure 2:
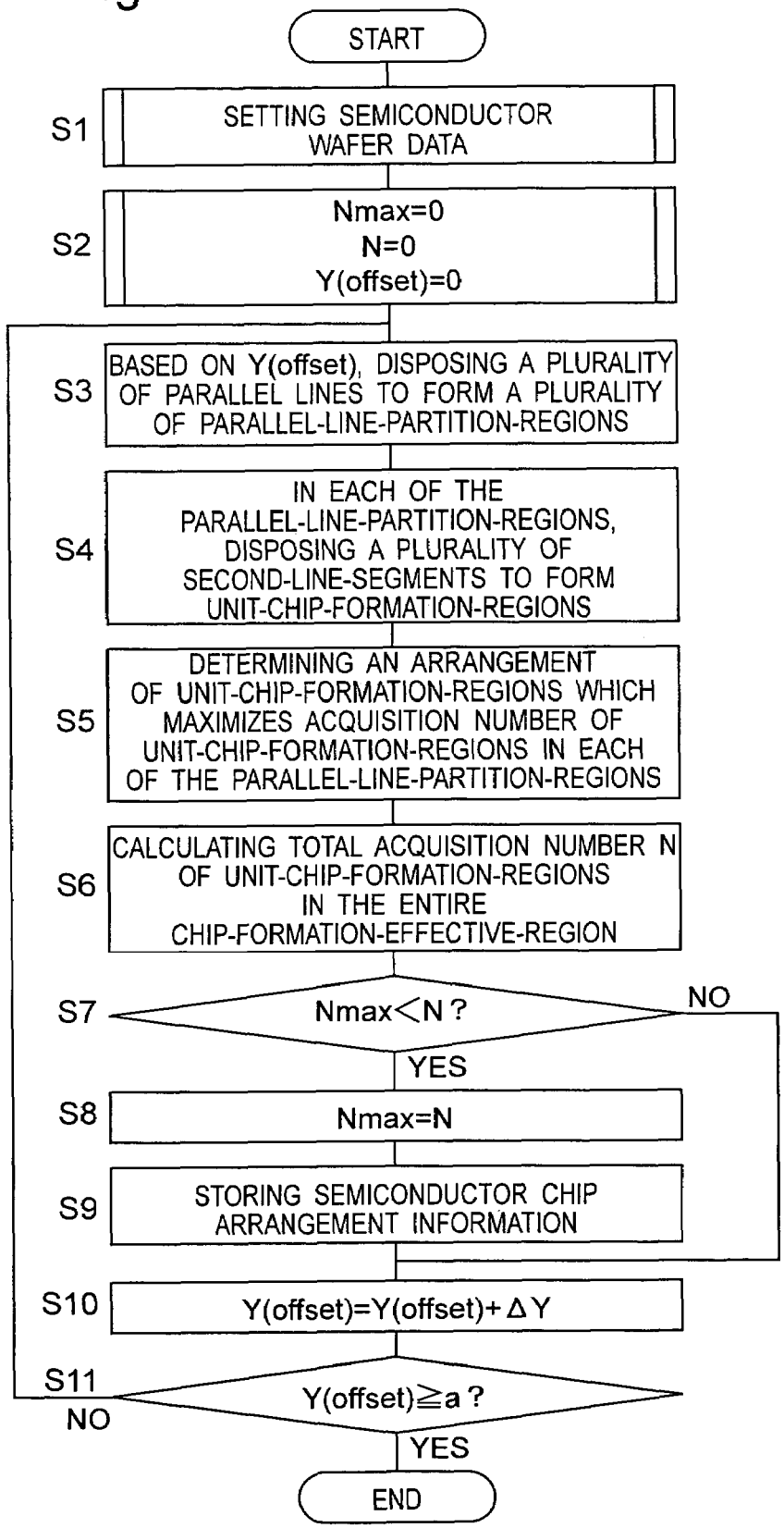
FIG. 2 is a flow chart showing the procedures for an arrangement determination method for semiconductor chips in the embodiment.

Next, description is hereinbelow given of a method for determining an arrangement of the respective semiconductor chips in the semiconductor wafer with use of the thus-configured semiconductor chip arrangement determination apparatus 101 with reference to a flowchart in FIG. 2 showing the processes thereof. It is to be noted that each process shown in the flowchart in FIG. 2 is carried out by the processing unit 90 executing the semiconductor chip arrangement determination program 91 in the semiconductor chip arrangement determination apparatus 101.

First, in step S1 in the flowchart in FIG. 2, the semiconductor wafer data 96 which is condition data necessary for executing the semiconductor chip arrangement determination program 91 is inputted.

Figure 3:
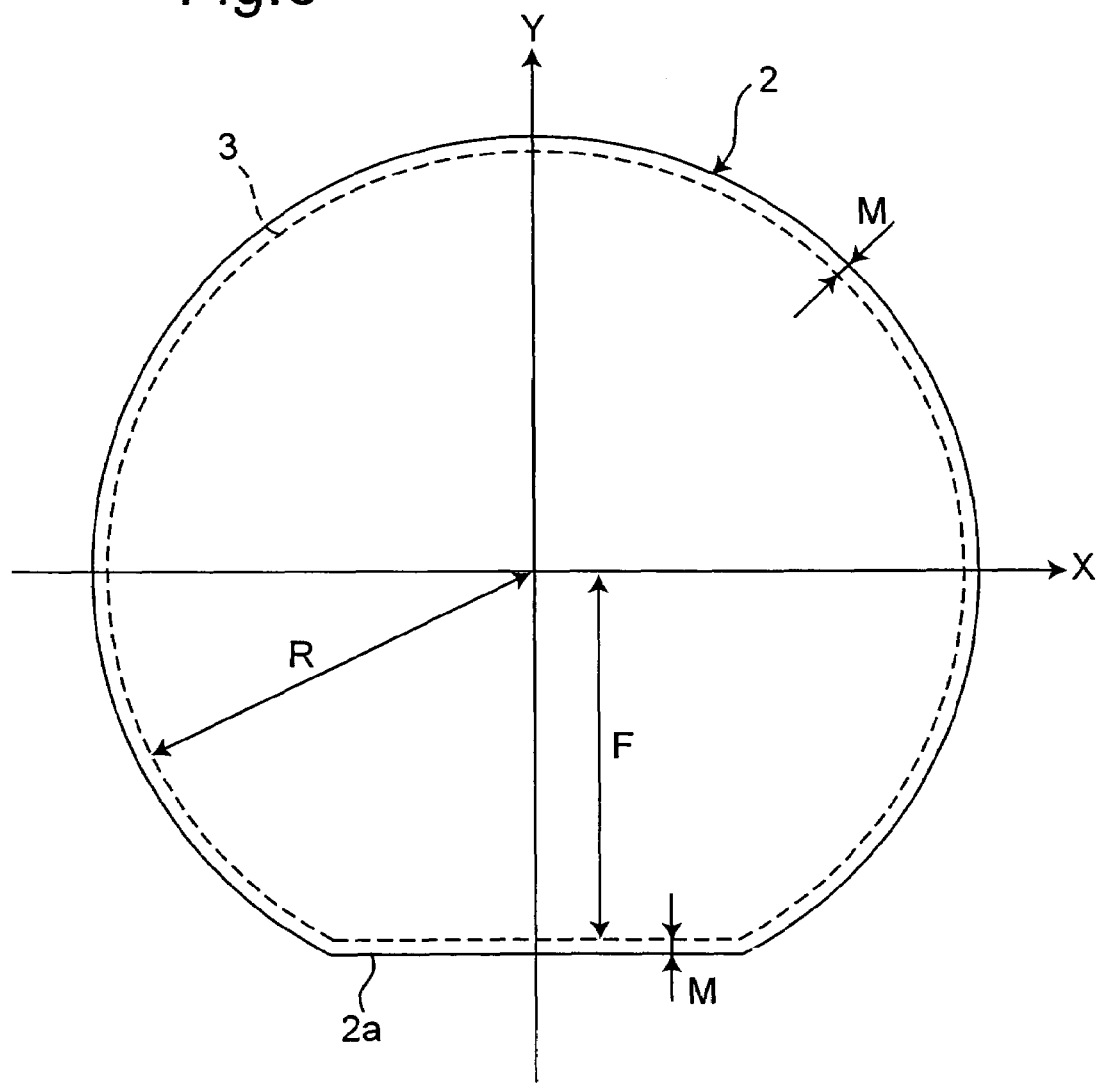
FIG. 3 is a schematic view showing an outline shape of a semiconductor wafer.

More specifically, a semiconductor wafer 2 is in an almost round shape as shown in FIG. 3 with an orientation flat 2a which is a linear end portion being formed on one end of the wafer 2. Moreover, as shown in FIG. 3, in the semiconductor wafer 2, a chip-formation-effective-region 3 (device-formation-effective-region) is disposed as a region allowing formation of the respective semiconductor chips in its inside in such a way that a region in the vicinity of a peripheral end portion which is highly susceptible to damages is excluded. In such a semiconductor wafer 2, outer radius R of the semiconductor wafer 2, a distance-dimension F from the center of the semiconductor wafer 2 to the orientation flat 2a, and margin width M that is a distance-dimension from the outer periphery of the semiconductor wafer 2 to the chip-formation-effective-region 3 are used as the semiconductor wafer data 96. It is to be noted that in FIG. 3, an X-axis and a Y-axis are disposed passing through the center of the semiconductor wafer 2 in directions along the surface of the semiconductor wafer 2 and orthogonal to each other, and the X-axis is disposed so as to be in parallel with the orientation flat 2a.

Figure 4:
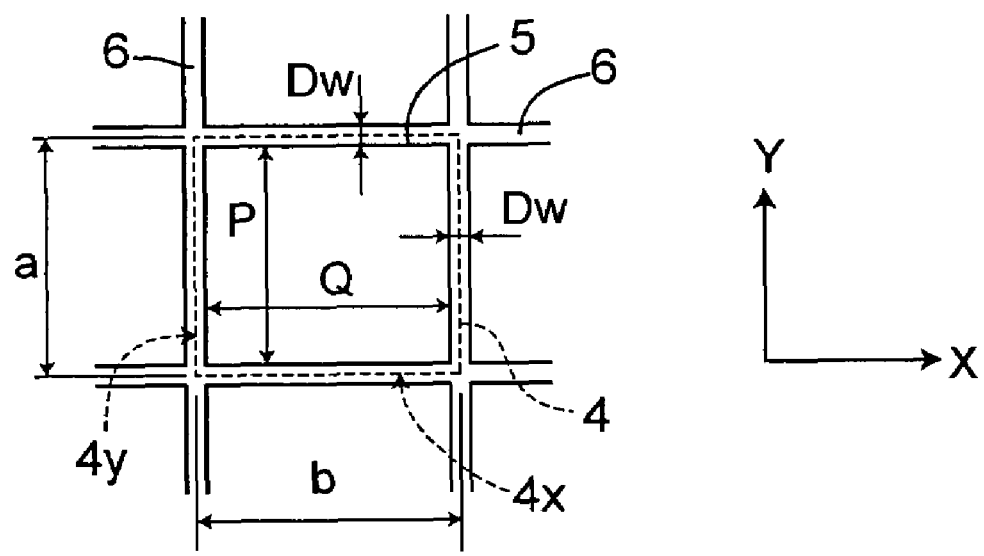
FIG. 4 is a schematic explanatory view for explaining about a unit-chip-formation-region.

FIG. 4 shows a schematic explanatory view showing the relation between a unit-chip-formation-region 4 (a unit-device-formation-region) disposed in the chip-formation-effective-region 3 on the semiconductor wafer 2 and a semiconductor chip 5 which is formed in practice. As shown in FIG. 4, the semiconductor chip 5 has an almost rectangular shape encircled by dividing lines 6 what is called dicing lines for dicing the semiconductor wafer into pieces. Herein, when as the outer size of the semiconductor chip 5, a length-dimension along a Y-axis direction as viewed in the drawing is "P", a length-dimension along an X-axis direction as viewed in the drawing is "Q", a width-dimension of the dividing line 6 is "Dw", a length-dimension of an X-line-segment (a first-line-segment) 4x disposed along the X-axis direction as viewed in the drawing which constitutes a unit-chip-formation-region 4 shown by a dot-line in the drawing is "b", and a length-dimension of a Y-line-segment (a second-line-segment) 4y disposed along the Y-axis direction as viewed in the drawing is "a", then the length-dimensions a, b of the respective line-segments of the unit-chip-formation-region 4 are defined by Equations (1) and (2):

$$a = P + Dw \quad (1)$$

$$b = Q + Dw \quad (2)$$

Therefore, the length-dimensions P, Q and the line width-dimension Dw of the dividing lines 6, which are external sizes of the semiconductor chip 5, i.e., the parameters (parameter information) to determine the size of the unit-chip-formation-region 4, are used as the semiconductor wafer data 96. It is to be noted that instead of using such length-dimensions P, Q and the line width-dimension Dw of the dividing lines 6 as the semiconductor wafer data 96, the size of the unit-chip-formation-region 4, i.e., the length-dimension b of the X-line-segment 4x and the length-dimension a of the Y-line-segment 4y, may be used directly as the semiconductor wafer data 96.

Figure 5:
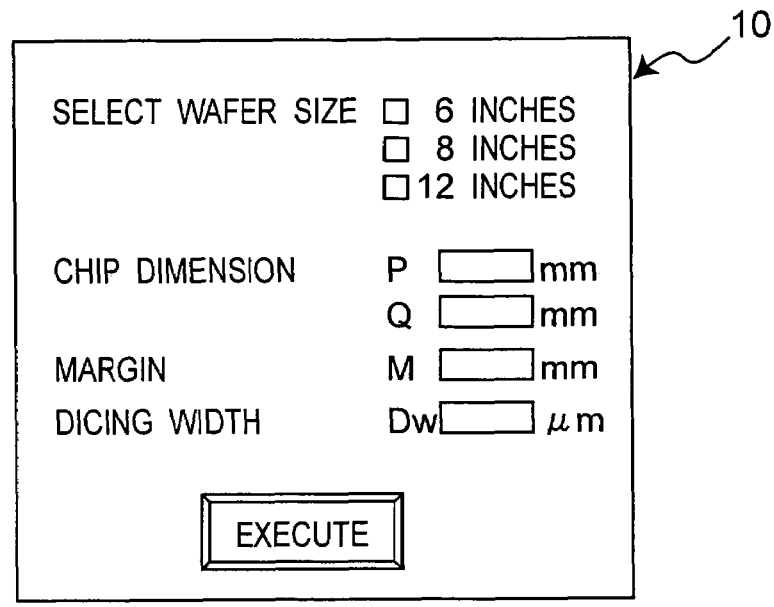
FIG. 5 is a screen display image view of a display included in the arrangement determination apparatus for semiconductor chips in FIG. 1 for showing a screen display for inputting various parameters.

Moreover, in the semiconductor chip arrangement determination apparatus 101, such respective sets of the semiconductor wafer data 96 may be inputted through the operating unit 93. A display screen 10 (e.g., monitor display screen) of the display 94 used during such an inputting operation of the semiconductor wafer data 96 by the operating unit 93 may be structured as shown FIG. 5. Moreover, as shown in the display screen 10 in FIG. 5, data on external radius R of the semiconductor wafer 2 of every type is stored in the storage unit 92 as the size of the semiconductor wafer 2, and an operator selects the type (6-inches, 8-inches or 12-inches) of the semiconductor wafer 2 on the display screen 10 to select a corresponding external radius R from the storage unit 92 based on the selected information. It is to be noted that inputting of the respective sets of the semiconductor wafer data 96 is not limited to the inputting performed through such an operating unit 93, but instead, the inputting of the semiconductor wafer data 96 may be performed through, for example, the communication interface 95 and the external storage medium interface 98.

Next, in step S2 in the flowchart in FIG. 2, a maximum acquisition number $N_{max}$ of the unit-chip-formation-regions 4 in the chip-formation-effective-region 3 of the semiconductor wafer 2, and an acquisition number N of the unit-chip-formation-regions 4 based on an arrangement of the respective unit-chip-formation-regions 4 in the chip-formation-effective-region 3 used during the process of the processing following the step S3 are initialized and set at $N_{max}=0$ and $N=0$. At the same time, an arrangement reference $Y_{(offset)}$ of the respective parallel lines used in the next step S3 is initialized and set at $Y_{(offset)}=0$.

Figure 7:
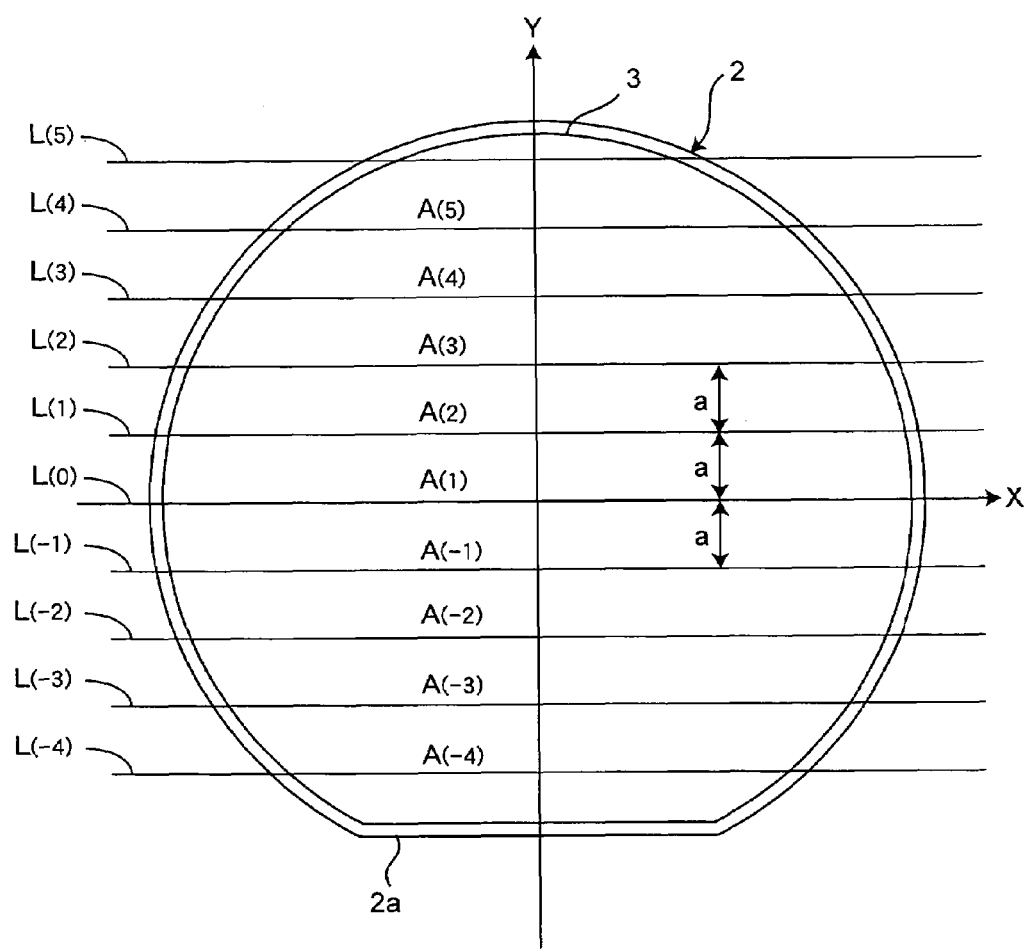
FIG. 7 is a schematic explanatory view for explaining the procedures in the arrangement determination method for semiconductor chips in the state in which parallel-line-partition-regions are formed.

Then, in step S3 in FIG. 2, based on the value of $Y_{(offset)}$ set in the step S2, a plurality of parallel lines L are disposed on the chip-formation-effective-region 3 as shown in FIG. 7. More specifically, as shown in FIG. 7, based on the setting of $Y_{(offset)}=0$, a reference parallel line $L_{(0)}$ that is one parallel line L parallel to the orientation flat 2a and the X-axis direction is disposed at a position of Y-coordinate 0, and a plurality of parallel lines L are disposed in the direction along Y-axis with the reference parallel line $L_{(0)}$ as a reference and with the length-dimension a of the Y-line-segment 4y of the unit-chip-formation-region 4 as a disposition interval (pitch) It is to be noted that as shown in FIG. 7, for identifying each of the parallel lines L, it is expressed as parallel line $L_{(n)}$. Herein, it is to be noted that "n" is an integer number indicating a disposition interval number from the reference parallel line $L_{(0)}$ with symbol "+" representing a Y-axis positive direction while symbol "−" representing a Y-axis negative direction.

For example, the parallel line L at the uppermost position as viewed in the drawing is expressed as $L_{(5)}$ (that is n=5) while the parallel line L positioned one line below the reference parallel line $L_{(0)}$ is expressed as $L_{(-1)}$ (that is n=−1).

By such disposition of the respective parallel lines L, the chip-formation-effective-region 3 of the semiconductor wafer 2 is divided into a plurality of parallel-line-partition-regions A enclosed by two parallel lines L and outer peripheral border lines of the chip-formation-effective-region 3. For identifying each separate parallel-line-partition-region A, each region is expressed as $A_{(n)}$ like the case of the parallel lines L, and a parallel-line-partition-region A formed by the reference parallel line $L_{(0)}$ and the parallel line $L_{(-1)}$ for example is expressed as $A_{(-1)}$ (that is n=−1).

Figure 8:
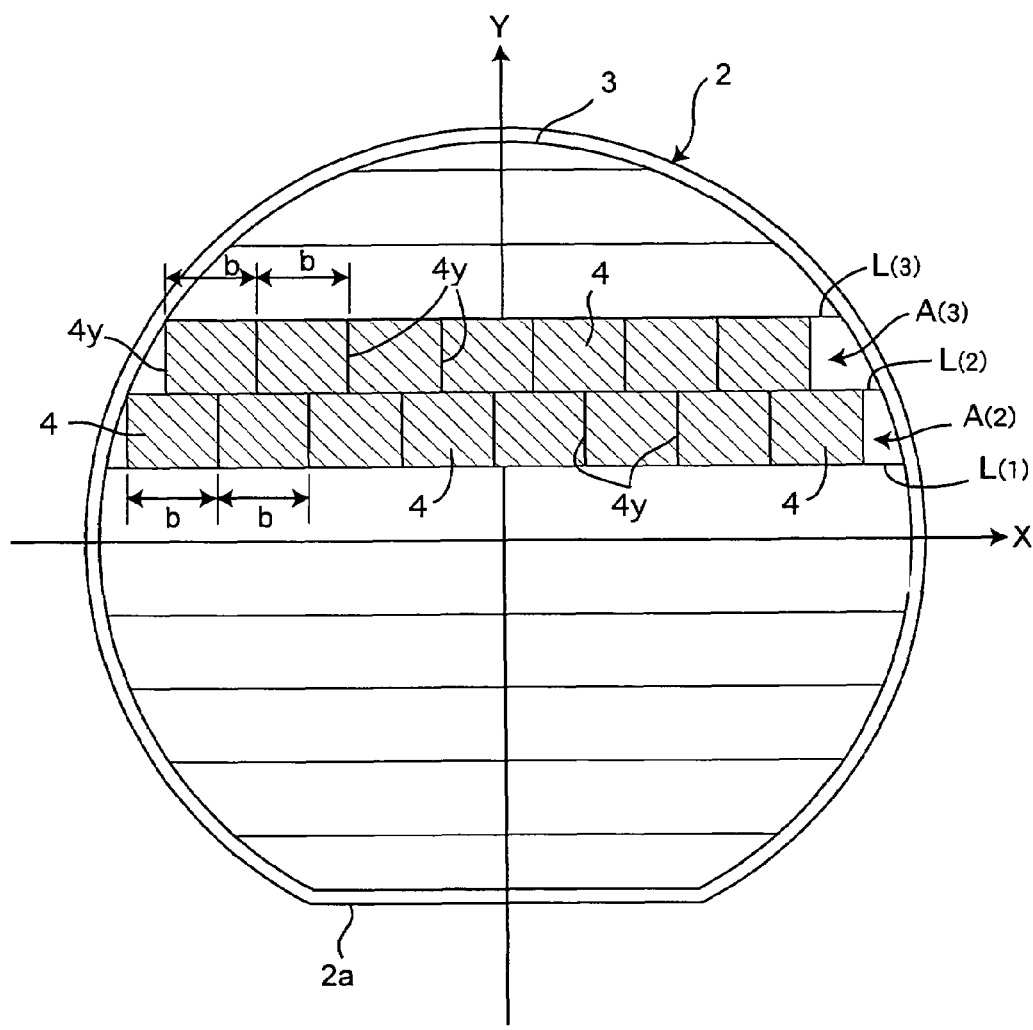
FIG. 8 is a schematic explanatory view for explaining the procedures in the arrangement determination method for semiconductor chips in the state in which the unit-chip-formation-regions are formed in the parallel-line-partition-regions.

Next, in step S4 in FIG. 2, in each of the parallel-line-partition-regions A, Y-line-segments 4y of the unit-chip-formation-region 4 are disposed with the length-dimension b of the X-line-segment 4x as a disposition interval (pitch), so that the unit-chip-formation-regions 4 partitioned by a pair of the parallel lines L and a pair of the Y-line-segments 4y are formed. More specifically, as shown in FIG. 8, for example in a parallel-line-partition-region $A_{(3)}$, a plurality of the Y-line-segments 4y are disposed with the interval pitch b in such a way that each end of the Y-line-segment 4y is positioned on the parallel line $L_{(2)}$ and the parallel line $L_{(3)}$. With this, a plurality of the unit-chip-formation-regions 4 are formed in the parallel-line-partition-region $A_{(3)}$. Moreover, disposition of the respective Y-line-segments 4y in the parallel-line-partition-region A is performed independently of and separately from the other parallel-line-partition-regions A. With such procedures, a plurality of the Y-line-segments 4y are disposed in all the parallel-line-partition-regions A, and the respective unit-chip-formation-regions 4 are arranged.

Next, in each of the parallel-line-partition-regions A, an arrangement which maximizes the acquisition number of the unit-chip-formation-regions 4 is determined (step S5). Thus, as a method for determining an arrangement of the unit-chip-formation-regions 4 which maximizes the acquisition number of the unit-chip-formation-regions 4 in each of the parallel-line-partition-regions A, various methods are considered. For example, as shown in FIG. 8, in the parallel-line-partition-region $A_{(3)}$, one Y-line-segment 4y is disposed on the left-hand side of the shorter parallel line $L_{(3)}$ among two parallel lines $L_{(2)}$ and $L_{(3)}$ as viewed in the drawing, and with use of the Y-line-segment 4y as a reference, different Y-line-segments 4y are disposed in sequence toward right-hand side in the X-axis direction as viewed in the drawing, so that the arrangement of respective unit-chip-formation-regions 4 which maximizes its acquisition number in the parallel-line-partition-region $A_{(3)}$ can be obtained. With the same procedure, determination of the arrangement which maximizes the acquisition number in all the parallel-line-partition-regions A is made independently in every parallel-line-partition-region A. Such independent arrangement determination for the unit-chip-formation-regions in every parallel-line-partition-region A may lead to the case in which, as shown in FIG. 8 for example, dicing positions (X-axis directional dicing positions) by the respective Y-line-segments 4y in the parallel-line-partition-region $A_{(3)}$ and dicing positions by the respective Y-line-segments 4y in the parallel-line-partition-region $A_{(2)}$ do not conform with each other. An arrangement of dicing positions in one parallel-line-partition-region A is determined independently of arrangements of dicing positions of other parallel-line-partition-regions A.

Figure 9:
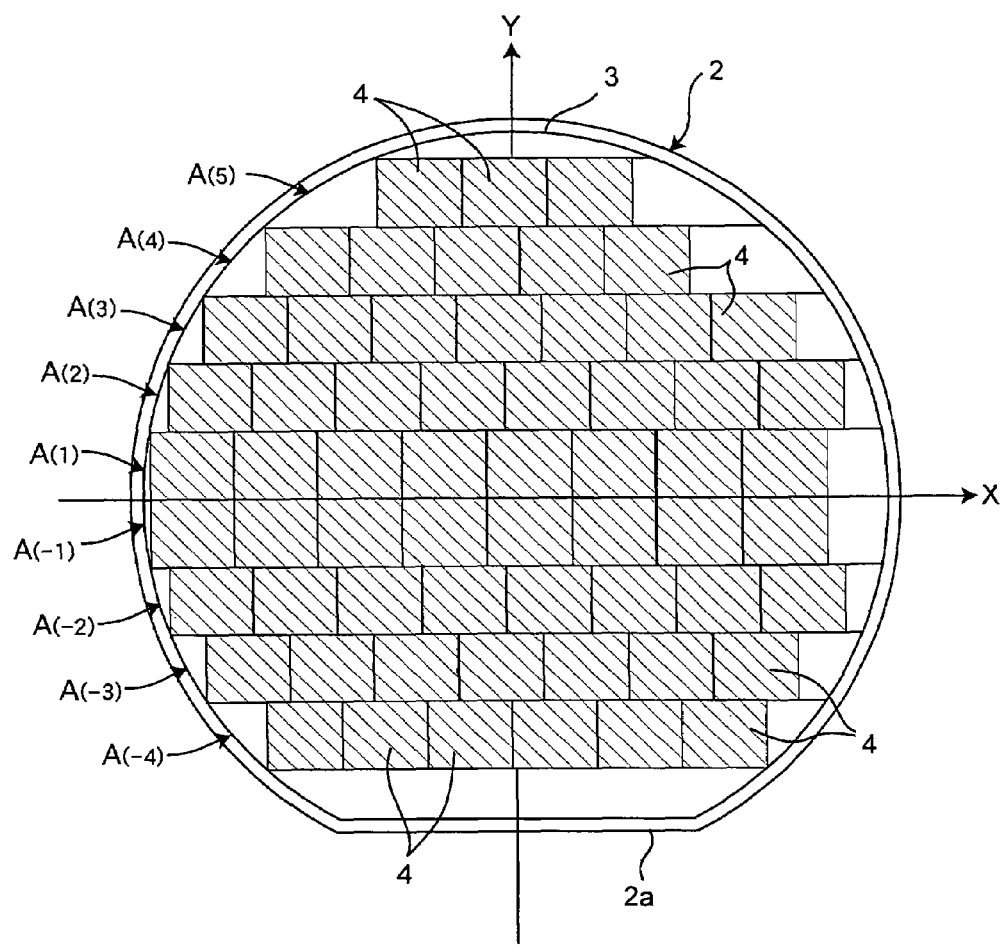
FIG. 9 is a schematic explanatory view for explaining the procedures in the arrangement determination method for semiconductor chips in the state in which an arrangement of the unit-chip-formation-regions is determined in all the parallel-line-partition-regions.

FIG. 9 shows an arrangement of the respective unit-chip-formation-regions 4 which makes it possible to achieve the maximum acquisition number independently in each of the parallel-line-partition-regions A. As shown in FIG. 9, the arrangement of the unit-chip-formation-regions 4 is determined so that the acquisition number of the unit-chip-formation-regions 4 is "3" in the parallel-line-partition-region $A_{(5)}$, "5" in the parallel-line-partition-region $A_{(4)}$, "7" in the parallel-line-partition-region $A_{(3)}$, 8 in the parallel-line-partition-region $A_{(2)}$, "8" in the parallel-line-partition-region $A_{(1)}$, "8" in the parallel-line-partition-region $A_{(-1)}$, "8" in the in the parallel-line-partition-region $A_{(-2)}$, "7" in the parallel-line-partition-region $A_{(-3)}$, and "6" in the parallel-line-partition-region $A_{(-4)}$. Based on such an arrangement, the total acquisition number of the unit-chip-formation-regions 4 in the respective parallel-line-partition-regions A, i.e., the total acquisition number N of the unit-chip-formation-regions 4 in the entire chip-formation-effective-region 3 with this arrangement is calculated to be N=60 (step S6).

Thus-calculated total acquisition number N is compared with the maximum acquisition number $N_{max}$ of the unit-chip-formation-regions 4 in the entire chip-formation-effective-region 3 (step S7). If it is determined that $N_{max}$<N, then the value of N is updated and stored as $N_{max}$ in step S8 while at the same time, the arrangement of the respective unit-chip-formation-regions 4 in FIG. 9 is stored as the semiconductor chip arrangement data 97 in step S9. In this case, since $N_{max}$ was initialized to be $N_{max}$=0 in step S2, the total acquisition number N of the unit-chip-formation-regions 4 obtained from the arrangement is stored as the maximum acquisition number $N_{max}$, and also the arrangement is stored as the same time. If it is determined in step S7 that the calculated total acquisition number N of the unit-chip-formation-regions 4 is smaller than the pre-stored maximum acquisition number $N_{max}$, then the procedures in the steps S8 and S9 are skipped. This is the end of the processing for obtaining the semiconductor chip arrangement data 97 which maximizes the acquisition number of the unit-chip-formation-regions 4 in the case of $Y_{(offset)}$=0. It is to be noted that such $N_{max}$ and determined arrangement of the unit-chip-formation-regions 4 are stored in the storage unit 92 as the semiconductor chip arrangement data 97.

Next, the parameter $Y_{(offset)}$ is replaced with $Y_{(offset)}=Y_{(offset)}+\Delta Y$ (step S10). More particularly, $Y_{(offset)}$ which determines a disposed position of the reference parallel line $L_{(0)}$ in the chip-formation-effective-region 3 is changed for "ΔY" so as to move the disposed position (i.e., to implement offset arrangement). The parameter ΔY is preset at a value smaller than the length-dimension a of the Y-line-segment 4y of the unit-chip-formation-region 4. By setting the parameter ΔY at a smaller value, the repeated number of times in the chip arrangement determination processing operation can be increased and more specific settings of an optimum arrangement become available, although this leads to increase in processing time. In the case of setting the parameter ΔY at a larger value, the repeated number of times decreases and this allows reduction in processing time. It is preferable that such a parameter ΔY is comprehensively determined based on a processing rate (e.g., capacity of CPU) in the processing unit 90 and an expected precision in arrangement settings.

Figure 10:
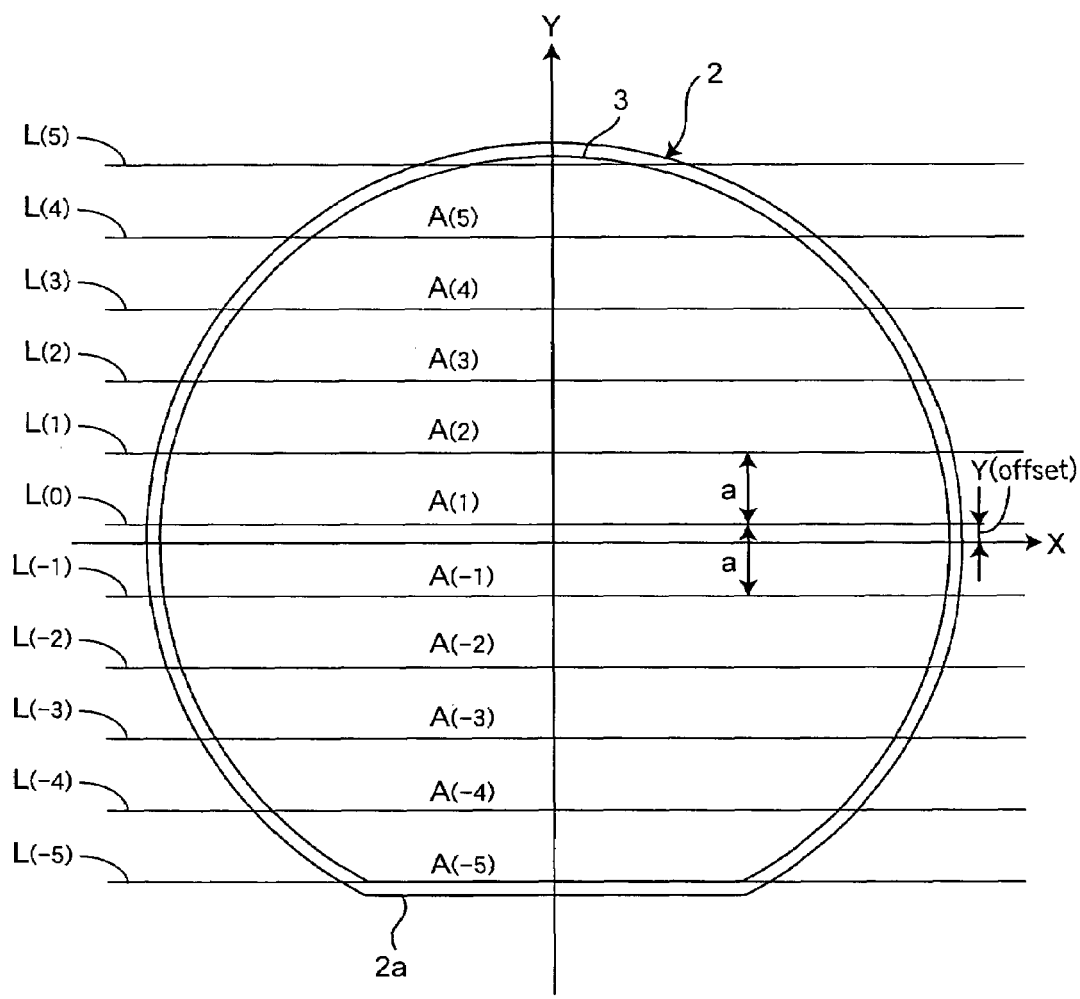
FIG. 10 is a schematic explanatory view for explaining the procedures in the arrangement determination method for semiconductor chips in the state in which the respective parallel lines are disposed in an offset state.

Moreover, it is determined in step S11 whether or not the parameter $Y_{(offset)}$ set (replaced) in step S10 is smaller than the length-dimension a of the Y-line-segment in the unit-chip-formation-region 4, and if it is determined to be smaller, the respective parallel lines L are disposed based on a newly set parameter $Y_{(offset)}$ in step S3. More specifically, as shown in FIG. 10, in the chip-formation-effective-region 3, the reference parallel line $L_{(0)}$ is disposed at a position away from the X-axis for $Y_{(offset)}$, and with the reference parallel line $L_{(0)}$ as a reference and with an interval pitch a, a plurality of the parallel lines L are disposed so as to form a plurality of the parallel-line-partition-regions A.

Figure 11:
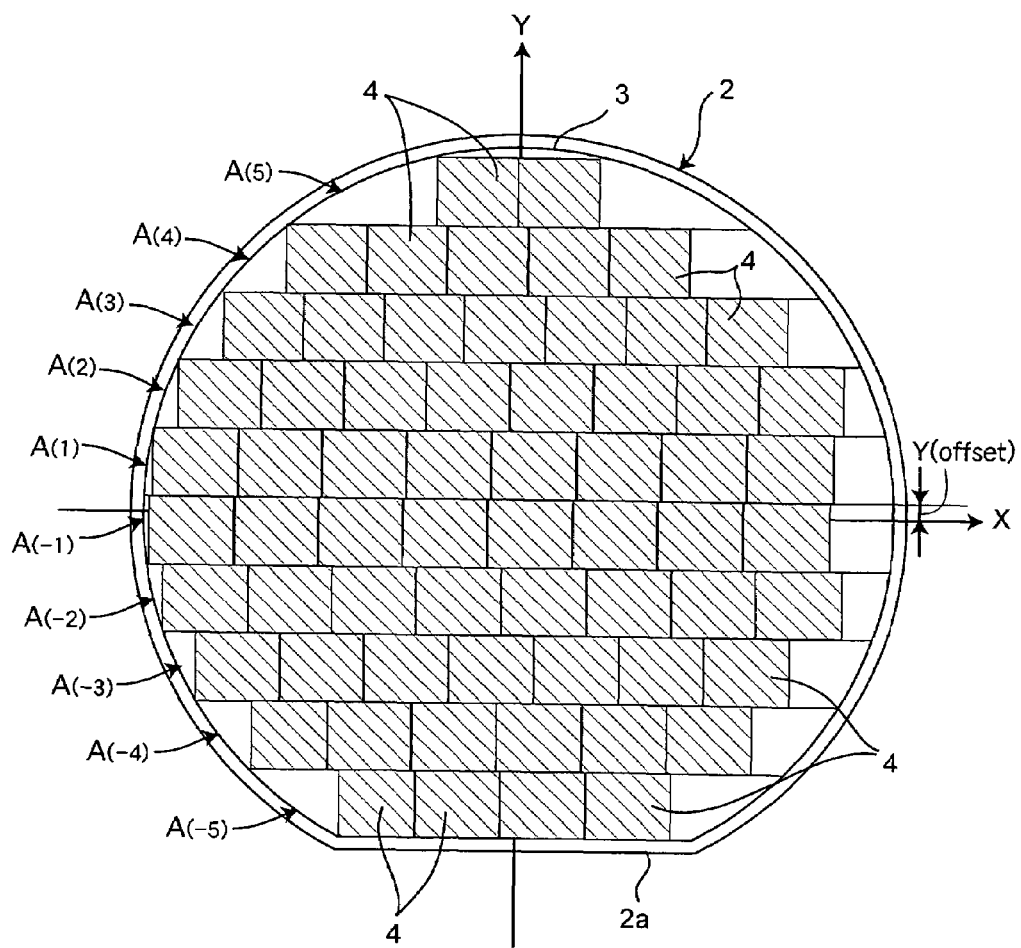
FIG. 11 is a schematic explanatory view for explaining the procedures in the arrangement determination method for semiconductor chips in the state in which an arrangement of the respective unit-chip-formation-regions is determined in the state of the offset arrangement of FIG. 10.

Then, in steps S4 and S5, in every parallel-line-partition-region A formed, an arrangement of the unit-chip-formation-regions 4 which makes it possible to offer the maximum acquisition number is determined independently of and separately from other parallel-line-partition-regions 4. Thus-determined arrangement of the respective unit-chip-formation-regions 4 is shown in FIG. 11. As shown in FIG. 11, "2" unit-chip-formation-regions 4 can be obtained in the parallel-line-partition-region $A_{(5)}$, "5" can be obtained in the parallel-line-partition-region $A_{(4)}$, "7" can be obtained in the parallel-line-partition-region $A_{(3)}$, "8" can be obtained in the parallel-line-partition-region $A_{(2)}$, "8" can be obtained in the parallel-line-partition-region $A_{(1)}$, "8" can be obtained in the parallel-line-partition-region $A_{(-1)}$, "8" can be obtained in the in the parallel-line-partition-region $A_{(-2)}$, "7" can be obtained in the parallel-line-partition-region $A_{(-3)}$, "6" can be obtained in the parallel-line-partition-region $A_{(-4)}$, and "4" can be obtained in the parallel-line-partition-region $A_{(-5)}$.

Based on such an arrangement, the total acquisition number N of the unit-chip-formation-regions 4 in the respective parallel-line-partition-regions A is calculated to be N=63 (step S6). Then, in step S7, it is determined that the calculated N=63 is larger than the formerly updated and stored $N_{max}$=60, and so in step S8, N=63 is newly updated and stored as the maximum acquisition number $N_{max}$. At the same time, the arrangement of the respective unit-chip-formation-regions 4 of N=63 is stored in the storage unit 92 as the semiconductor chip arrangement data 97 associated with $N_{max}$=63. It is to be noted that such memory is updated and stored in the storage unit 92 as the semiconductor chip arrangement data 97.

Then, in step S10, the parameter $Y_{(offset)}$ is updated, and the respective procedures from steps S3 to S10 are repeated till the parameter $Y_{(offset)}$ is equal to or larger than the length-dimension a of the Y-line-segment 4y of the unit-chip-formation-region 4 in step S11.

Then, when it is confirmed that the parameter $Y_{(offset)}$ reaches the length-dimension a in step S11, execution of the semiconductor chip arrangement determination program 91 is completed.

Figure 6:
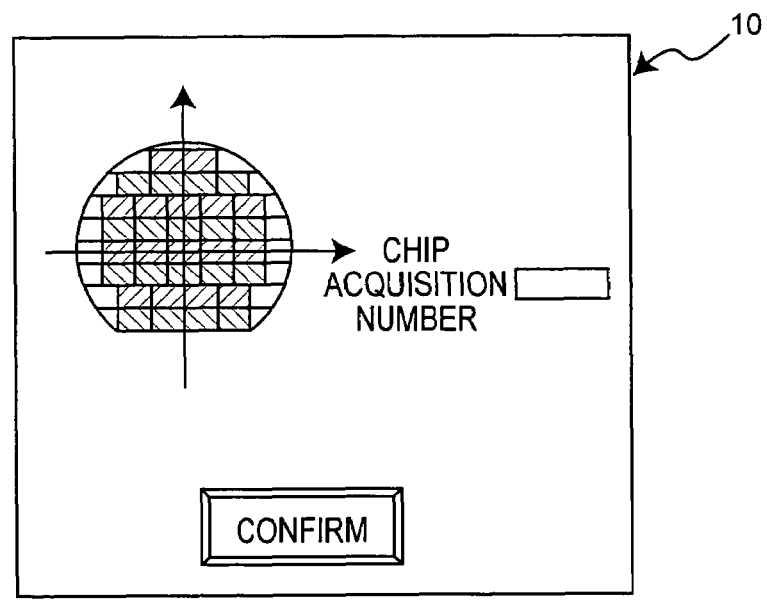
FIG. 6 is a screen display image view of the display for showing a screen display in the state in which an arrangement of semiconductor chips is determined.

After that, the latest semiconductor chip arrangement data 97 stored in the storage unit 92 is displayed together with the maximum acquisition number $N_{max}$ on, for example, the display screen 10 of the display 94 as shown in FIG. 6, so that the operator may be informed of the finalized (prepared) arrangement data (information). Moreover, the data may be sent to the outside of the semiconductor chip arrangement determination apparatus 101 through the communication interface 95 or the external storage medium interface 98 where necessary.

It is to be noted that the above-stated respective steps (procedures) are carried out by the processing unit 90 executing the semiconductor chip arrangement determination program 91 in the semiconductor chip arrangement determination apparatus 101. Such a semiconductor chip arrangement determination program 91 is structured so as to be able to execute a series of procedures at least including a first procedure (step S3) of forming a plurality of the parallel-line-partition-regions A, a second procedure (step S4) of forming the unit-chip-formation-regions 4 in the respective parallel-line-partition-regions A, a third procedure (steps S5 to S9) of determining an arrangement of the unit-chip-formation-regions 4 in the entire chip-formation-effective-region 3, and a fourth procedure (steps S10, S11) of performing offset arrangement of the parallel lines L.

Moreover, these procedures are specifically performed by the processing unit 90 executing the program 91, and a function or a structure for executing the first procedure included in the processing unit 90 is the parallel-line-partition-regions determination means (the parallel-line-partition-regions forming processing unit), a function or a structure for executing the second procedure included in the processing unit 90 is the unit-device-formation-region formation means (the unit-device-formation-region forming processing unit), and a function or a structure for executing the third procedure included in the processing unit 90 is the unit-device-formation-region arrangement determination means (the unit-device-formation-region arrangement determining processing unit).

Figure 12:
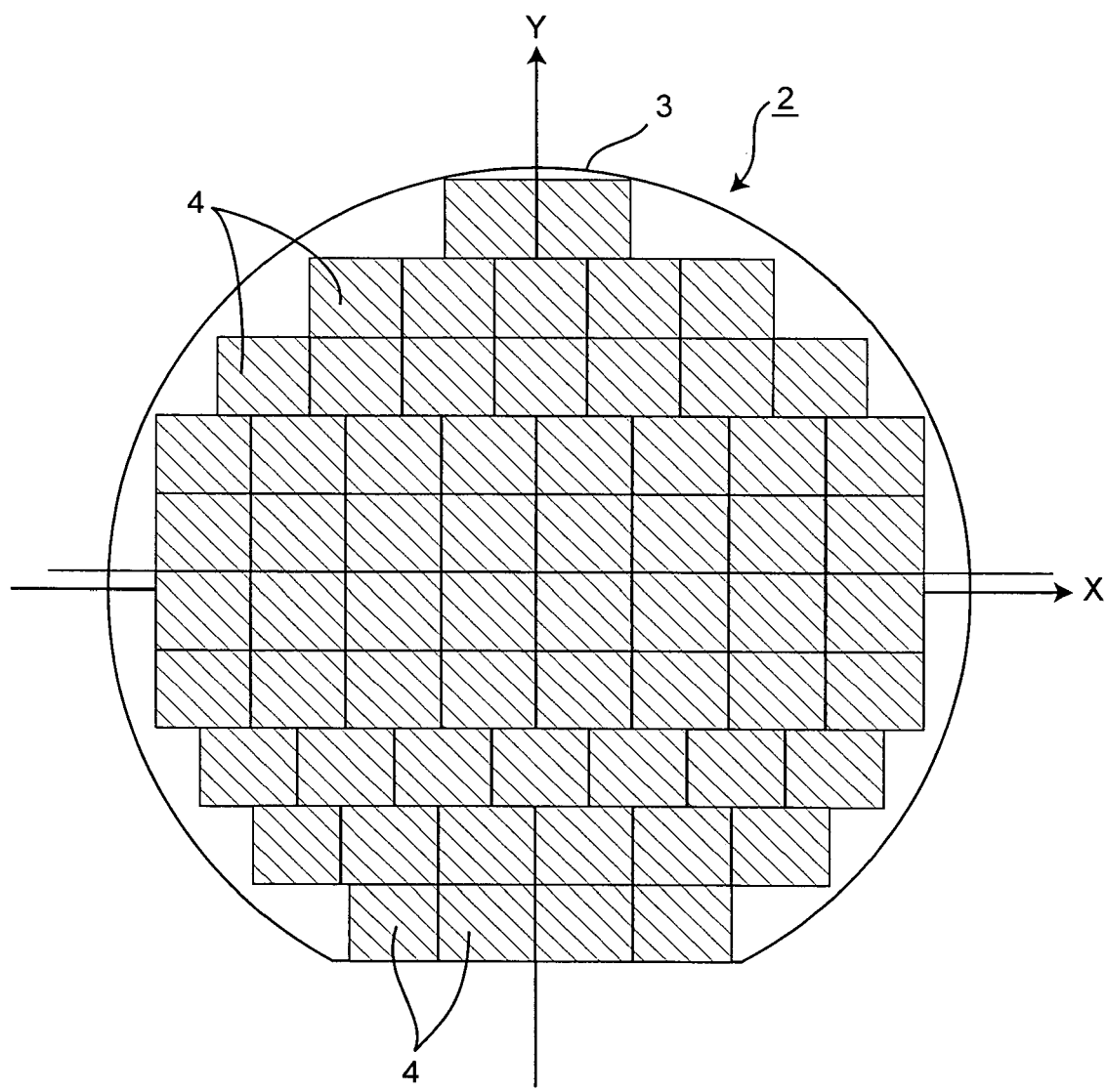
FIG. 12 is a schematic view showing the arrangement of the unit-chip-formation-regions in FIG. 11 subjected to centering.
Figure 13:
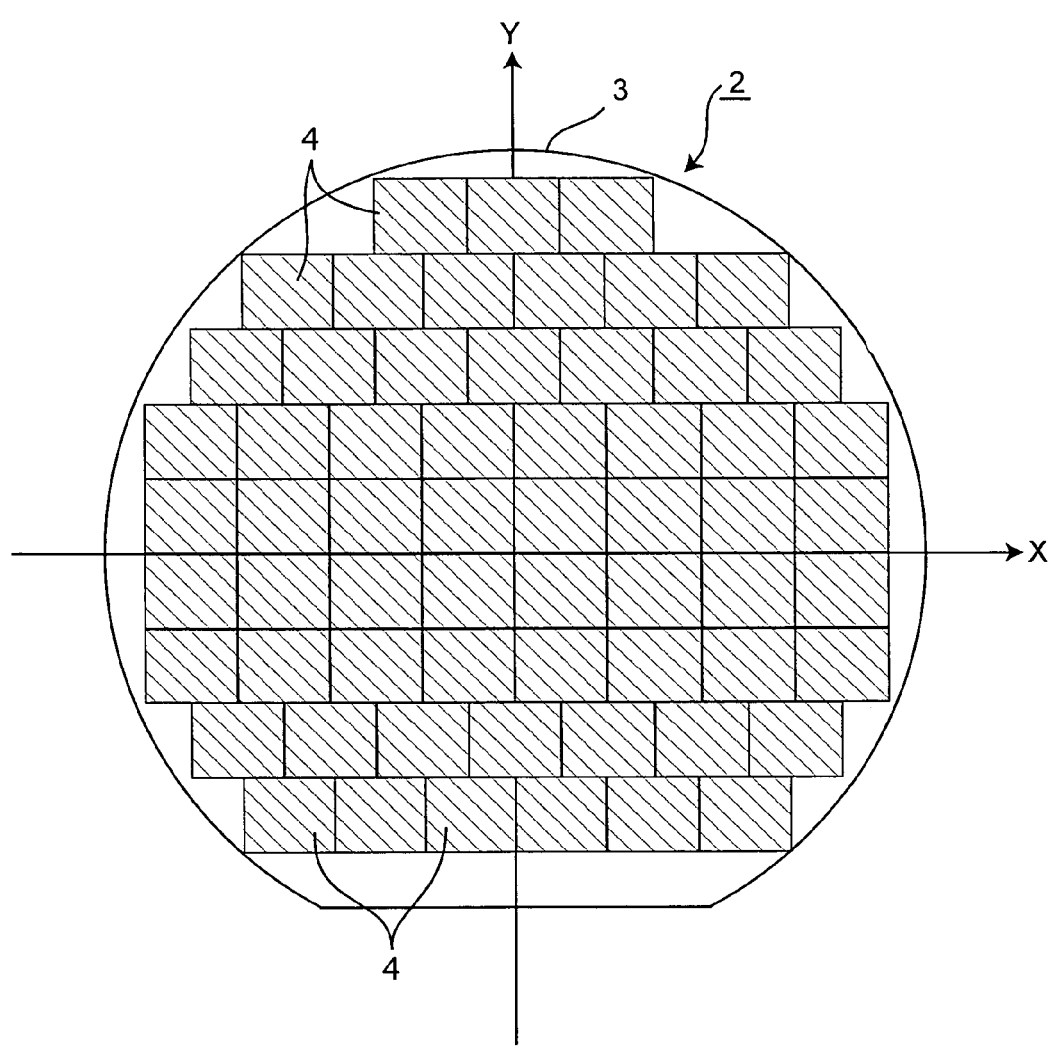
FIG. 13 is a schematic view showing the arrangement of the unit-chip-formation-regions in FIG. 9 subjected to centering.

The thus-determined arrangement of the respective semiconductor chips is not used as it is in the semiconductor chip formation process performed thereafter, but is subjected to centering so as to have an even arrangement on the semiconductor wafer 2. For example, in the case where an arrangement as shown in FIG. 11 is determined in arrangement determination processing for semiconductor chips, the respective unit-chip-formation-regions 4 are subjected to centering per parallel-line-partition-region A with the Y-axis as a reference axis so as to be changed to an arrangement as shown in FIG. 12. Moreover, in the case where, for example, an arrangement as shown in FIG. 9 is determined in arrangement determination processing for semiconductor chips, the respective unit-chip-formation-regions 4 are subjected to centering per parallel-line-partition-region A with the Y-axis as a reference axis so as to be changed to an arrangement as shown in FIG. 13. It is to be noted that such "centering" is for centering of the arrangement of the unit-chip-formation-regions 4 along the X-axis direction as viewed in the drawing based on the determined arrangement data and is not for changing the acquisition number of the unit-chip-formation-regions 4.

Figure 14:
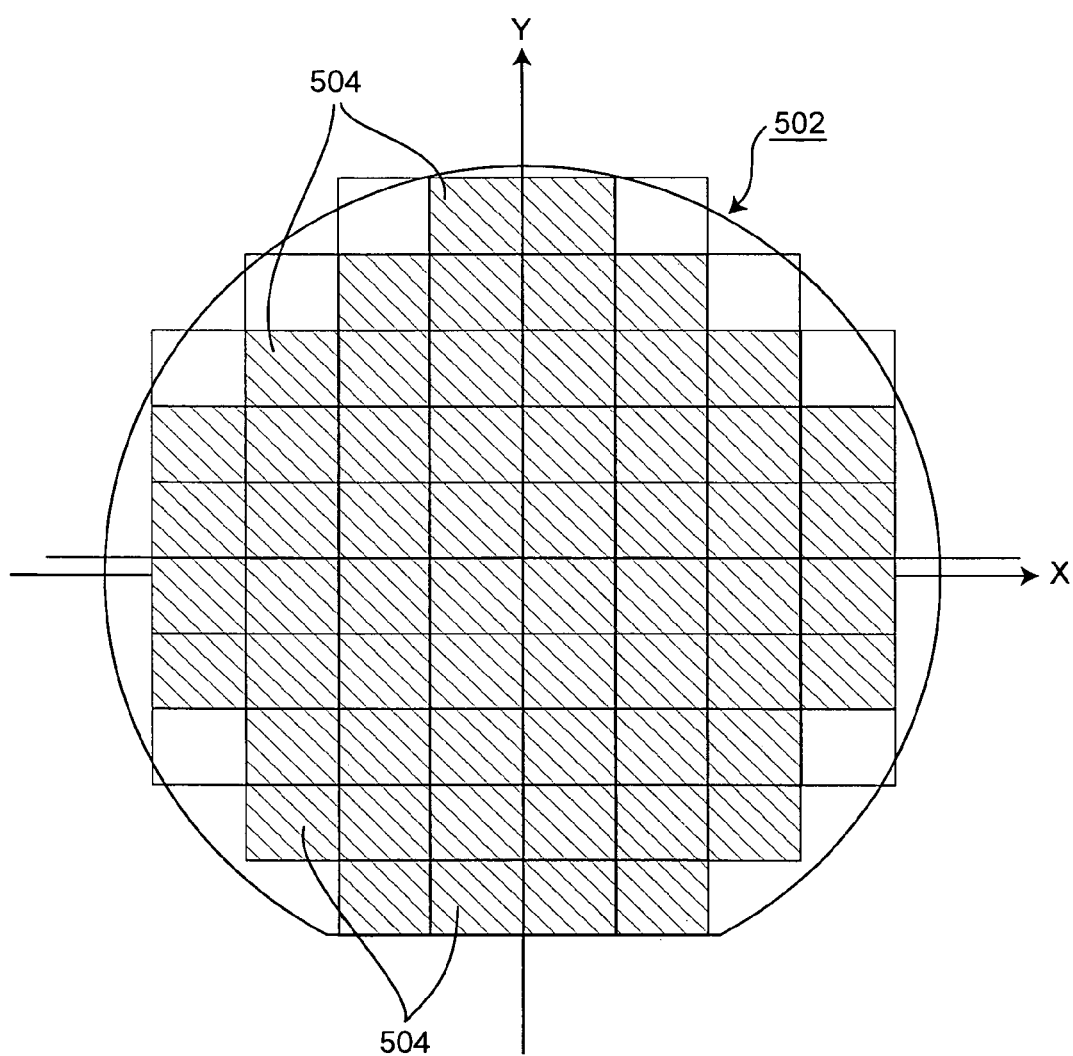
FIG. 14 is a schematic view of an arrangement of unit-chip-formation-regions determined by a conventional arrangement determination method for semiconductor chips for showing a comparative arrangement to the arrangement in FIG. 12.
Figure 15:
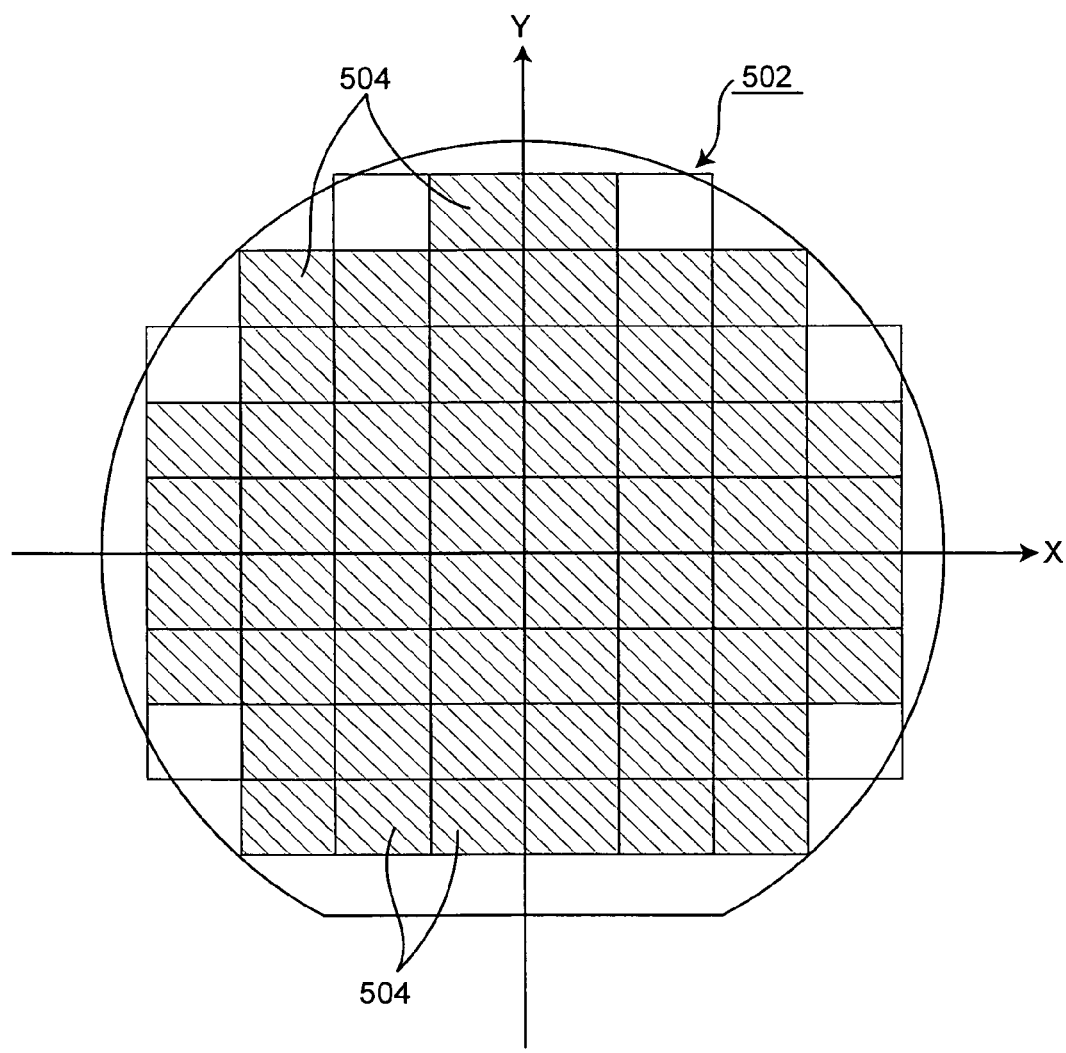
FIG. 15 is a schematic view of an arrangement of unit-chip-formation-regions determined by a conventional arrangement determination method for semiconductor chips for showing a comparative arrangement to the arrangement in FIG. 13.

Herein, assuming that the arrangement determined by the arrangement determination method for semiconductor chips in the present embodiment is, for example, an arrangement as shown in FIG. 12 or FIG. 13, the arrangement is compared to an arrangement obtained by the conventional arrangement determination method for semiconductor chips which depends on a grid-like (matrix) arrangement. FIG. 14 shows a grid-like arrangement of unit-chip-formation-regions 504 on a conventional semiconductor wafer 502 corresponding to the arrangement of the unit-chip-formation-regions 4 on the semiconductor wafer 2 shown in FIG. 12 in the present invention, and FIG. 15 shows a grid-like conventional arrangement corresponding to the arrangement of FIG. 13 in the present embodiment. It is to be noted that the arrangements are compared in the state that the positions of the respective parallel lines L in the arrangement of the present invention are in conformity with the positions of respective dicing lines along the X-axis direction in the conventional arrangement.

In the semiconductor wafer 2 in the present embodiment shown in FIG. 12, total "63" unit-chip-formation-regions 4 can be obtained, whereas in the conventional semiconductor wafer 502 with the grid-like arrangement shown in FIG. 14, only total "60" unit-chip-formation-regions 504 can be obtained. This indicates that applying the arrangement of the present embodiment allows acquisition of three more semiconductor chips on one semiconductor wafer 2.

Moreover, in the semiconductor wafer 2 in the present embodiment shown in FIG. 13, total "60" unit-chip-formation-regions 4 can be obtained, whereas in the conventional semiconductor wafer 502 with a grid-like arrangement shown in FIG. 15, only total "58" unit-chip-formation-regions 504 can be obtained. This indicates that applying the arrangement of the present embodiment allows acquisition of two more semiconductor chips on one semiconductor wafer 2.

Figure 16:
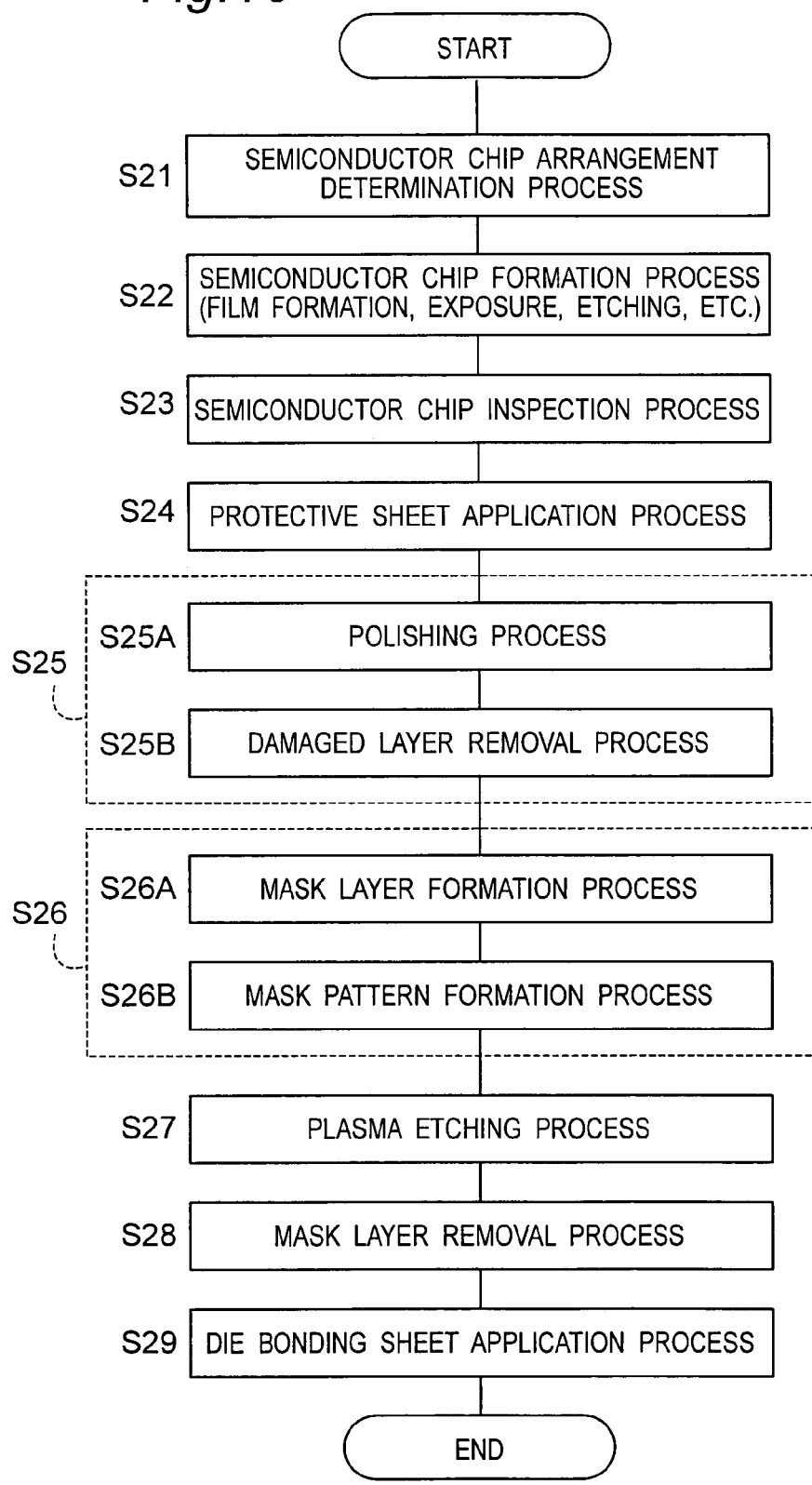
FIG. 16 is a flowchart showing the procedures for semiconductor chip manufacturing method with use of the arrangement determination method for semiconductor chips in the embodiment.

Description is now given of a manufacturing method for semiconductor chips based on the thus-determined arrangement of the semiconductor chips with reference to a flowchart shown in FIG. 16 as well as schematic cross sectional views of semiconductor wafers for explaining the respective processes in the manufacturing method shown in FIG. 17 to FIG. 26.

First, in step S21 in FIG. 16, an arrangement of respective unit-chip-formation-regions 4 on the semiconductor wafer 2 is determined by an aforementioned method in the semiconductor chip arrangement determination apparatus 101 (semiconductor chip arrangement determination process). The thus-determined arrangement is subjected to the aforementioned centering.

Figure 17:
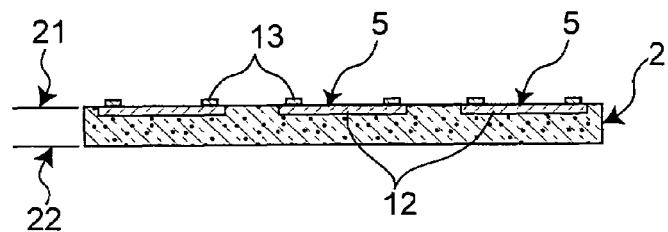
FIG. 17 is a schematic explanatory view for explaining each process in the flowchart in FIG. 16 for showing a semiconductor wafer in the state in which semiconductor chips are formed.

Next, based on the thus-determined arrangement of the semiconductor chips 5, treatments such as film formation, exposure and etching are applied to a circuit-formation-face 21 (or first surface) of the semiconductor wafer 2 to form the semiconductor chips 5 (semiconductor chip formation process: step S22). As shown in FIG. 17, each of the semiconductor chips 5 comprises a circuit formation portion 12 and a plurality of external connection electrodes 13 made of conductive materials in such a way as to be exposed from the circuit-formation-face 21 in the circuit formation portion 12.

After that, an inspection to determine whether or not the formation state of each of the formed semiconductor chips 5 has any defects is performed (semiconductor chip inspection process: step S23), and as for those semiconductor chips 5 determined to have defects, their defect information is stored in association with arrangement information of the semiconductor chips 5 on the semiconductor wafer 2 so that the semiconductor chips 5 are managed so as not to be used thereafter.

Figure 18:
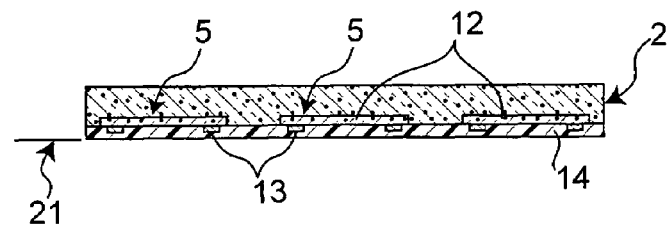
FIG. 18 is a schematic explanatory view for showing a semiconductor wafer in the state in which a protective sheet is applied through a protective sheet application process.

Next, as shown in FIG. 18, in order to prevent the circuit-formation-face 21 from being damaged during each processing performed on the semiconductor wafer 2 after completion of the inspection process, a protective sheet 14 is removably applied to the circuit-formation-face 21 via an adhesive agent (protective sheet application process: step S24). It is to be noted that the protective sheet 14 to be used is the one shaped to have almost the same shape as an external shape of the semiconductor wafer 2 so as to cover the entire surface of the circuit-formation-face 21 and not to protrude outward from the end portion of the semiconductor wafer 2. By using the protective sheet 14 in such a shape, it becomes possible to prevent such damage that during the following treatments such as plasma treatment, the protective sheet 14 protruding from the semiconductor wafer 2 is burnt by plasma from occurring.

Figure 19:
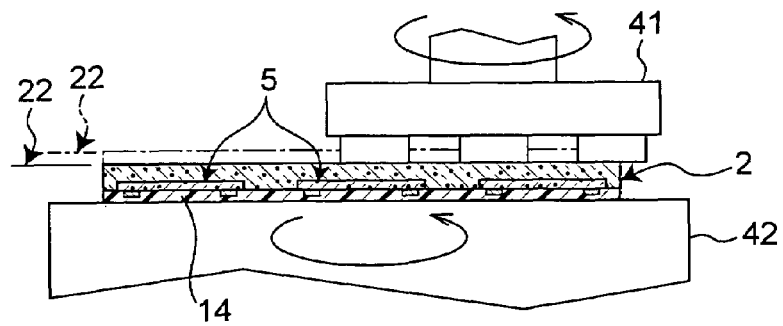
FIG. 19 is a schematic explanatory view for showing a semiconductor wafer in the state in which a polishing process is carried out.

Next, in step S25A in FIG. 16, a polishing process for thinning the thickness of the semiconductor wafer 2 is performed. More specifically, as shown in FIG. 19, with the circuit-formation-face 21 of the semiconductor wafer 2 being on the lower side as viewed in the drawing, the semiconductor wafer 2 is placed on a holding table 42 through the protective sheet 14 and the placement position is retained. In this state, a treatment-target-face 22 (a second surface or a mask disposed-side surface on which a mask is placed in the following processes) that is a surface on the opposite side of the circuit-formation-face 21 of the semiconductor wafer 2 is polished by using a grinding wheel 41. On the lower face of the grinding wheel 41 as viewed in the drawing, a grinding stone is fixed, and the grinding stone is rotated along the treatment-target-face 22 of the semiconductor wafer 2 in the state of being in contact with the surface to perform polishing of the treatment-target-face 22. By such polishing treatment, the semiconductor wafer 2 is thinned to have a thickness of about 100 μm or smaller, e.g., 50 μm.

Figure 20:
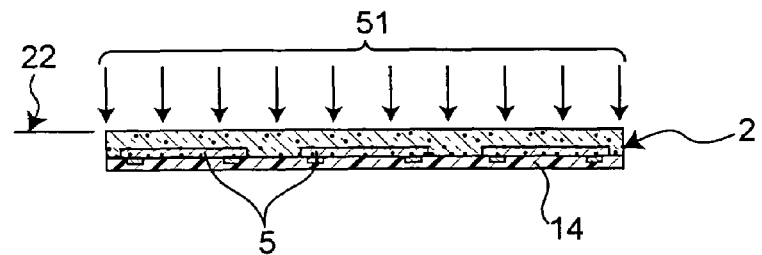
FIG. 20 is a schematic explanatory view for showing a semiconductor wafer in the state in which a damaged layer removal process is carried out.

In the vicinity of the surface of the treatment-target-face 22 of the treatment-target-face 22 subjected to the polishing process, a damaged layer retaining stress imparted by polishing with the grinding wheel 41 is formed. Such a damaged layer being left on the formed semiconductor chips 5 degrades the resistance of the semiconductor chips 5, and causes deterioration of their quality. In order to prevent such deterioration of the quality of the semiconductor chips 5, the damaged layer formed on the treatment-target-face 22 of the semiconductor wafer 2 is removed as shown in FIG. 20 (a damaged layer removal process, step S25B). For example, as shown in FIG. 20, an etching solution (sulfuric acid, nitric acid, phosphoric acid, fluorinated acid, etc.) 51 is brought into contact with the damaged layer formed on the treatment-target-face 22 of the semiconductor wafer 2 so as to remove the damaged layer by the chemical reaction (wet etching treatment). It is to be noted that instead of by using the wet etching treatment as the removal processing of the damaged layer, the damaged layer may be removed by applying plasma etching to the treatment-target-face 22 (plasma etching treatment), or the damaged layer may be removed by performing polishing on the treatment-target-face 22. Moreover, the process combining the polishing process in step S25A and the damaged layer removal process in step S25B constitutes the thinning process in step S25.

Figure 21:
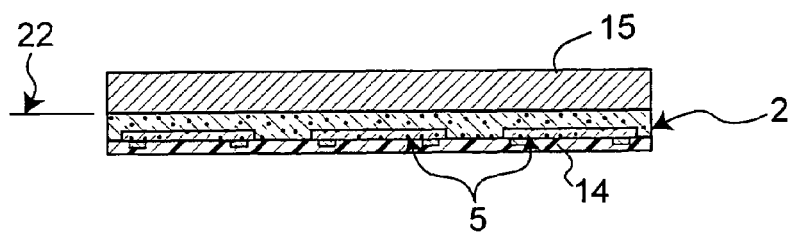
FIG. 21 is a schematic explanatory view for showing a semiconductor wafer in the state in which a mask layer is formed through a mask layer formation process.

After such a thinning process is applied, as shown in FIG. 21, a mask layer 15 is formed on the treatment-target-face 22 of the semiconductor wafer 2 (a mask layer formation process, step S26A). The mask layer 15 is for forming mask patterns for use in the later-described plasma dicing process (or plasma etching process), in which the mask patterns are formed from a material, such as aluminum and resin, having tolerance against plasma produced with use of fluorinated gasses.

In the case of using aluminum, a method for forming an aluminum thin film on the treatment-target-face 22 by deposition and a method for applying a foil-like aluminum thin film are used. In the case of using resin, a method for applying a resin formed in a film shape and a method for coating the treatment-target-face 22 with a liquid resin by spin coat method and the like may be used.

Figure 22:
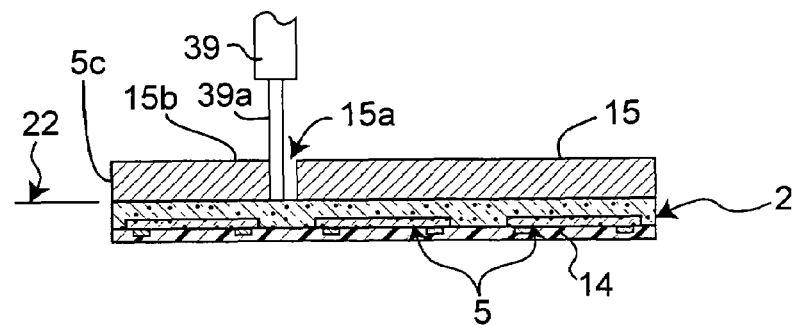
FIG. 22 is a schematic explanatory view for showing a semiconductor wafer in the state in which a mask removal portion is formed through a mask pattern formation process.

Next, as shown in FIG. 22, mask patterns are formed by partial removal of the mask layer 15 by, for example, laser processing (a mask pattern formation process or a mask layer partial removal process: step S26B). More specifically, as shown in FIG. 22, based on the determined semiconductor chip arrangement data 97, a laser beam 39a is irradiated along the dicing positions by a laser irradiation unit 39 so as to perform partial removal of the mask layer 15. As a result, the dicing lines are set by masks 15b of the remaining mask layer 15 and by mask removal portions 15a that are portions removed as described above (i.e., mask patterns 15c are formed). It is to be noted that in the case where an arrangement of semiconductor chips as shown in FIG. 12 is used as the semiconductor chip arrangement data 97 for example, the X-line-segments 4x and the Y-line-segments 4y constituting the respective unit-chip-formation-regions 4 function as the dicing lines (or the dicing positions). Therefore, the parallel lines L which do not constitute the X-line-segments 4x do not function as the dicing lines.

Moreover, instead of forming and processing the mask patterns 15c for the mask layer 15, it is possible to dispose the mask layer 15 having the mask patterns 15c, which was processed in advance based on the semiconductor chip arrangement data 97, on the treatment-target-face 22 of the semiconductor wafer 2.

Figure 27:
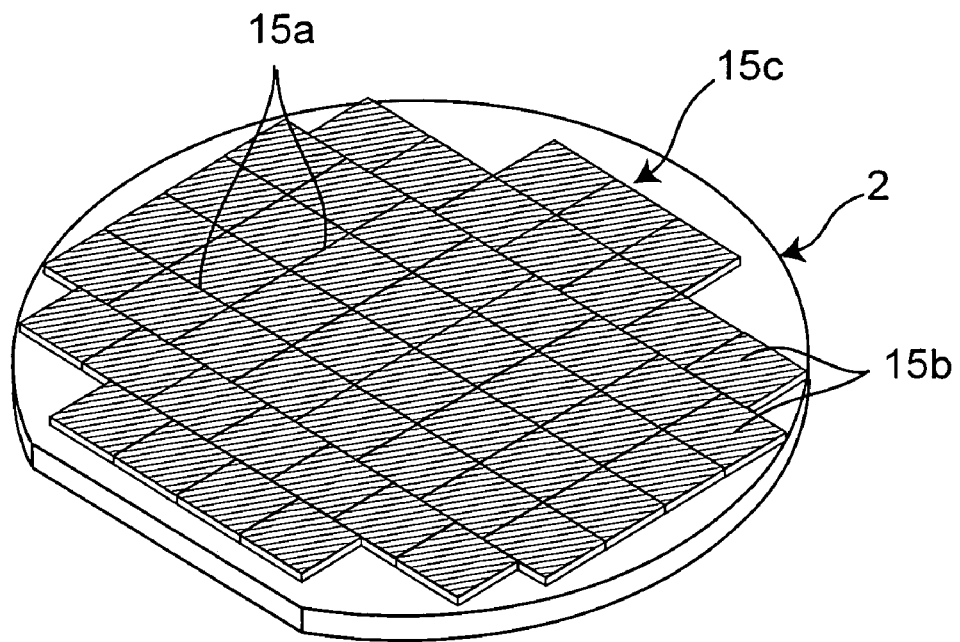
FIG. 27 is a schematic perspective view for showing a semiconductor wafer in the state in which a mask pattern is formed.

By carrying out the process (S26) comprises the mask layer formation process in the step S26A and the mask patterns formation process in step S26B being combined, for example, the mask patterns 15*c* as shown in the schematic cross sectional view of the semiconductor wafer 2 in FIG. 27 are formed.

Figure 23:
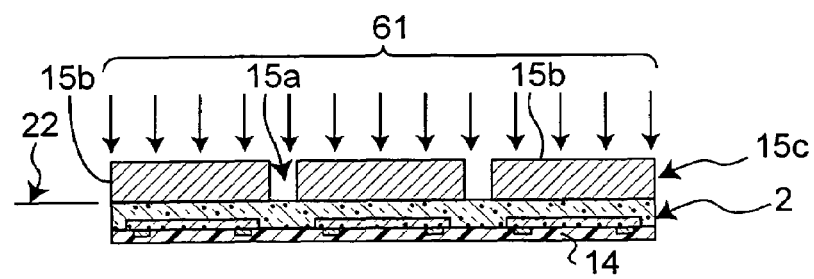
FIG. 23 is a schematic explanatory view for showing a semiconductor wafer in the state in which etching is performed through a plasma dicing process.
Figure 24:
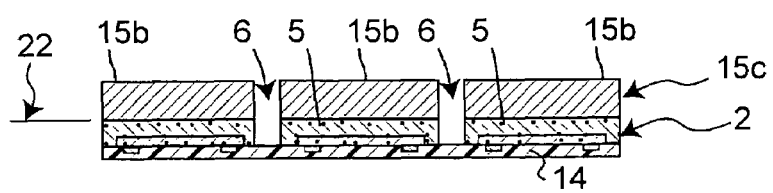
FIG. 24 is a schematic explanatory view for showing a semiconductor wafer in the state of being diced into respective separate semiconductor devices.

Next, plasma etching is applied to the semiconductor wafer 2 having the mask patterns 15*c* for setting the dicing lines formed thereon, by which the semiconductor wafer 2 is diced into separate semiconductor chips 5 along the dicing lines (plasma dicing process: step S27). More specifically, the semiconductor wafer 2 is placed in a treatment chamber of an unshown plasma treatment apparatus, and the pressure inside the treatment chamber is decompressed to a specified pressure for vacuumization while at the same time, a plasma generation gas is supplied. In this state, a high frequency voltage is applied to generate plasma, and the generated plasma 61 is irradiated to the surface of the semiconductor wafer 2 with the mask patterns 15c formed thereon as shown in FIG. 23. By such irradiation of the plasma 61, portions corresponding to the mask removal portions 15*a* on the treatment-target-face 22 of the semiconductor wafer 2, i.e., an exposed surface of the treatment-target-face 22, is etched off. As a result, the thickness of portions of the semiconductor wafer 2 corresponding to the exposed surfaces is thinned, and the portions are removed at the end. Consequently, as shown in FIG. 24, the semiconductor wafer 2 is diced into each of the separate semiconductor chips 5 along the dicing lines (dividing lines).

Figure 25:
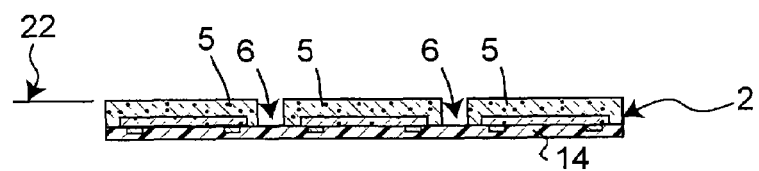
FIG. 25 is a schematic explanatory view for showing a semiconductor wafer in the state in which the mask is removed through a mask layer removal process.
Figure 28:
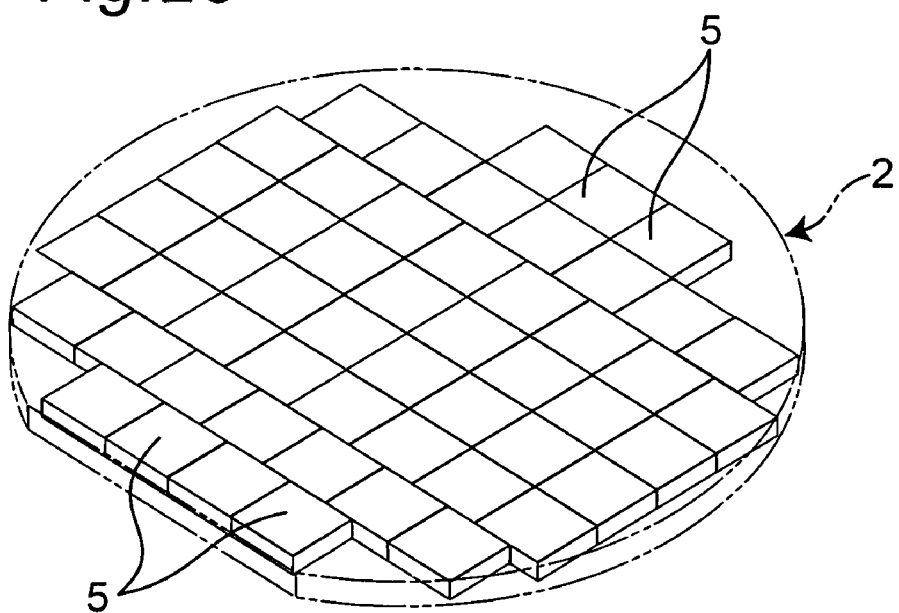
FIG. 28 is a schematic perspective view for showing a semiconductor wafer in the state in which the mask is removed after plasma dicing.

Then, as shown in FIG. 25, the masks 15*b* remaining on the treatment-target-face 22 of the separated respective semiconductor chips 5 are removed by, for example, application of ashing (mask layer removal process: step S28). FIG. 28 shows a schematic cross sectional view of the semiconductor wafer 2 subjected to such a mask layer removal process.

Figure 26:
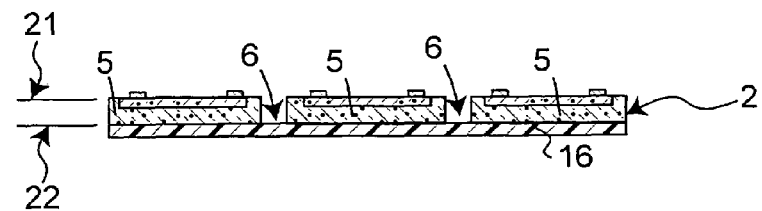
FIG. 26 is schematic explanatory view for showing a semiconductor wafer in the state in which a die bonding sheet is applied.

After that, as shown in FIG. 26, an adhesive sheet (die bonding sheet) 16 is applied to the treatment-target-face 22 of the semiconductor wafer 2 (die bonding sheet application process: step S29), and then the protective sheet 14 protecting the circuit-formation-face 21 of the semiconductor wafer 2 is removed. The adhesive sheet 16 has a size larger than the semiconductor wafer 2 and the periphery thereof is fixed by an unshown wafer-ring (jig). Holding the wafer-ring allows handling of the semiconductor wafer 2.

Thus, based on the determined semiconductor chip arrangement data 97, respective separate semiconductor chips 5 are manufactured from the semiconductor wafer 2. Moreover, when dicing of the respective semiconductor chips 5 formed based on the semiconductor chip arrangement data 97 are performed in the semiconductor wafer 2, conventionally-used mechanical cutting with use of dicers and laser beams is not employed but dicing by plasma etching is employed so that reliable dicing can be achieved even with the semiconductor chips 5 arranged without having matrix dicing lines. Further, centering is applied to the arrangement of the unit-chip-formation-regions 4 determined by the arrangement determination method for semiconductor chips 5, which makes it possible to ensure uniformity of etching during plasma etching operation, thereby allowing dicing in an efficient state.

In the above-described arrangement determination method for semiconductor chips, description has been made of the case where as a method for determining the arrangement of the unit-chip-formation-region 4 which maximizes the acquisition number in each of the parallel-line-partition-regions A in step S5 in the flowchart shown in FIG. 2, the Y-line-segment 4*y* is disposed on either end portion of the parallel line L (parallel line-segment) out of two parallel lines L constituting the parallel-line-partition-region A, and with the Y-line-segment 4*y* as a reference, the respective Y-line-segments 4*y* are disposed in sequence with a specified interval pitch. However, calculation of the maximum acquisition number of the unit-chip-formation-regions 4 in the parallel-line-partition-regions A is not limited to adoption of such a method, and other various methods are applicable. Hereinbelow, description will be give of a modified example of the calculation method of the maximum acquisition number of the unit-chip-formation-regions 4 in the parallel-line-partition-regions A with reference to a schematic explanatory view shown in FIG. 29.

Figure 29:
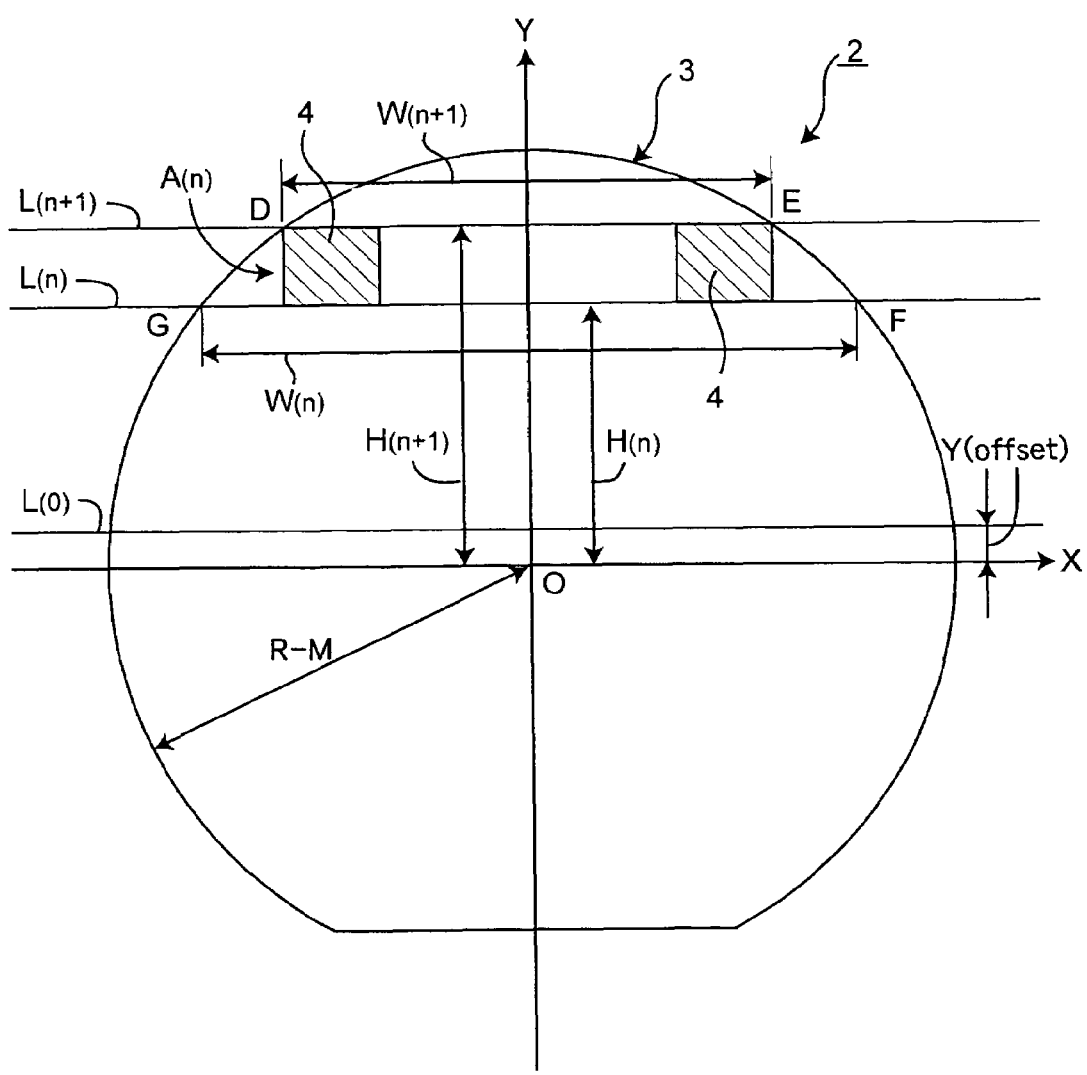
FIG. 29 is a schematic explanatory view showing a method for calculating a maximum value of acquisition number of the unit-chip-formation-regions in the parallel-line-partition-regions according to a modified example of the embodiment.

First, as shown in FIG. 29, attention is paid to one parallel-line-partition-region $A_{(n)}$ formed by disposition of respective parallel lines L in the chip-formation-effective-region 3, and a method for calculating the maximum acquisition number of the unit-chip-formation-regions 4 in the parallel-line-partition-region $A_{(n)}$ is described. It is to be noted that n is an integer number and an interval pitch number from the reference parallel line $L_{(O)}$ is expressed by positive/negative symbols in the Y-axis positive direction and negative direction.

As shown in FIG. 29, the parallel-line-partition-region $A_{(n)}$ is expressed as regions DEFG, which are sandwiched between a parallel line-segment DE having a length-dimension $W_{(n+1)}$ (part of a parallel line $L_{(n+1)}$) and a parallel line-segment GF having a length-dimension $W_{(n)}$ (part of a parallel line $L_{(n)}$). Moreover, the reference parallel line $L_{(O)}$ is disposed away from the X-axis for $Y_{(offset)}$ and therefore a distance $H_{(n+1)}$ from the X-axis to the parallel line-segment DE and a distance $H_{(n)}$ from the X-axis to the parallel line-segment GF may be defined by Equations (3) and (4):

$$H_{(n)} = a \cdot n + Y_{(offset)} \quad (3)$$

$$H_{(n+1)} = a \cdot (n+1) + Y_{(offset)} \quad (4)$$

Further, the length-dimension $W_{(n+1)}$ of the parallel line-segment DE and the length-dimension $W_{(n)}$ of the parallel line-segment GF may be defined by Equations (5) and (6) with use of $H_{(n)}$, $H_{(n+1)}$ and a region radius (R-M) of the chip-formation-effective-region 3:

$$W_{(n)} = 2 \cdot \{(R-M)^2 - H_{(n)}^2\}^{1/2} \quad (5)$$

$$W_{(n+1)} = 2 \cdot \{(R-M)^2 - H_{(n+1)}^2\}^{1/2} \quad (6)$$

Among thus-obtained parallel line-segment DE and the parallel line-segment GF, the parallel line-segment with a shorter length-dimension, i.e., the parallel line-segment DE in the state shown in FIG. 29, is selected, and an integer obtained by dividing the length-dimension $W_{(n+1)}$ of the parallel line-segment DE by the length-dimension b of the X-line-segment 4*x* of the unit-chip-formation-region 4 may be calculated as a maximum acquisition number of the unit-chip-formation-regions 4 in the parallel-line-partition-region $A_{(n)}$.

By using such a method, without arranging the unit-chip-formation-regions 4 in the parallel-line-partition-regions A in actuality, the maximum acquisition number may be calculated through geometrical calculation.

According to the embodiment, when an arrangement of the respective unit-chip-formation-regions 4 in the chip-formation-effective-region 3 on the semiconductor wafer 2 is determined, with use of the length-dimension a of the Y-line-segment 4*y* which is a length-dimension of one side of the unit-chip-formation-region 4 as an interval pitch, a plurality of parallel lines L are disposed in the chip-formation-effective-region 3 so as to form a plurality of the parallel-line-partition-regions A, the maximum number (acquisition number) of the unit-chip-formation-regions 4 disposable within each of the formed parallel-line-partition-regions A is calculated independently of and separately from other parallel-line-partition-regions A, and an arrangement which can offer the maximum number is determined as the arrangement of the unit-chip-formation-regions 4 in the entire chip-formation-effective-region 3. Thus, by determining the arrangement of the respective unit-chip-formation-regions 4 which makes it possible to acquire a maximum number of the unit-chip-formation-regions 4 in one parallel-line-partition-region A independently of other parallel-line-partition-regions A, it becomes possible to realize the arrangement of semiconductor chips which is free from the conventional restraints that the arrangement of a unit-chip-formation-regions should be in a matrix state or a grid state and which is capable of reducing the unused region in the chip-formation-effective-region 3 so as to allow effective usage of the region 3.

Further, by changing the arrangement of the respective parallel lines L in the chip-formation-effective-region 3 and calculating the maximum acquisition number and the arrangement of the unit-chip-formation-regions 4 with the changed arrangement of the parallel lines L, the arrangement capable of offering a larger acquisition number may be calculated through repeated processing.

Moreover, according to such an arrangement determination method for semiconductor chips, the case in which the number of the unit-chip-formation-regions 4 which are aligned in every parallel-line-partition-region A is an even number and the case in which the number is an odd number are present in a mixed state, and therefore this arrangement is largely different from the conventional arrangement in which the number of the unit-chip-formation-regions in every line is unified to be either one of an even number or an odd number. More particularly, the parallel-line-partition-regions A in which the number of the unit-chip-formation-regions 4 disposed is an odd number and the parallel-line-partition-regions A in which the number is an even number are present in a mixed state in one chip-formation-effective-region 3, and therefore the dicing lines for dicing the respective unit-chip-formation-regions 4 are not arranged in the conventional matrix state. Thus, when the dicing lines are not arranged in a matrix state, then in the semiconductor chip dicing process, dicing with use of the conventional mechanical cutting means with use of dicers and the like cannot be performed. However, even in such cases, disposing a mask layer for setting dicing lines in such a way as to conform with dicing positions not in the matrix state on the surface of the semiconductor wafer 2, and applying plasma etching (i.e., plasma dicing) to the semiconductor wafer 2 with the mask layer disposed thereon allow, dicing of the respective separate semiconductor chips along the dicing lines. Therefore, applying the plasma dicing to the semiconductor wafer on which respective semiconductor chips are formed based on the arrangement determined by the arrangement determination method for the semiconductor chips in the present embodiment allows the semiconductor wafer 2 to be diced into the respective separate semiconductor chips, and makes it possible to realize a specific manufacturing method for semiconductor chips with use of the arrangement determination method.

Although description has only been given of the case where the orientation flat 2a is formed in the semiconductor wafer 2 in the embodiment, the arrangement determination method for semiconductor chips in the embodiment is applicable to semiconductor wafers without the orientation flat.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2004-215364 filed on Jul. 23, 2004 including specification, drawing and claims are incorporated herein by reference in its entirety.

What is claimed is:

1. A manufacturing method for semiconductor devices, which is a method for determining an arrangement of a plurality of unit-device-formation-regions that are rectangular regions for forming the semiconductor devices in a device-formation-effective-region on a semiconductor wafer and manufacturing the semiconductor devices based on the determined arrangement, the method comprising:

forming a plurality of parallel-line-partition-regions partitioned by an outer periphery of the device-formation-effective-region on the wafer and a plurality of parallel lines, by disposing the respective parallel lines in the device-formation-effective-region on the wafer with use of a length-dimension of a second-line-segment out of a first-line-segment and the second-line-segment which constitute the unit-device-formation-region and are orthogonal to each other as an arrangement interval, through execution of computer processing;

forming one or a plurality of the unit-device-formation-regions partitioned by the respective parallel lines and a plurality of the second-line-segments in the parallel-line-partition-regions, by disposing the respective second-line-segments in a direction orthogonal to the parallel lines in the respective parallel-line-partition-regions with use of a length-dimension of the first-line-segment as an arrangement interval, through execution of computer processing;

determining an arrangement of the unit-device-formation-regions which maximizes each number of the unit-device-formation-regions formed in each of the respective parallel-line-partition-regions independently of other parallel-line-partition-regions as an arrangement of the respective unit-device-formation-regions in the entire device-formation-effective-region on the wafer, through execution of computer processing, and thereby preparing the determined arrangement as an arrangement information for the unit-device-formation-regions;

forming the respective semiconductor devices on the semiconductor wafer based on the prepared arrangement information; and performing a plasma etching process to the semiconductor wafer with a mask disposed thereon from a masked surface to divide the semiconductor wafer into the respective semiconductor devices in accordance with the arrangement information, and thereby the respective divided semiconductor devices are manufactured.

2. The manufacturing method for semiconductor devices as defined in claim 1, wherein region information for the unit-device-formation-regions and the device-formation-effective-region are inputted into a computer, then the respective computer processing is executed with use of the inputted region information, and thereby the arrangement information for the unit-device-formation-regions is prepared.

3. The manufacturing method for semiconductor devices as defined in claim 1, further comprising:
   after forming the semiconductor devices, defining dividing lines for dividing the-wafer into the respective separate semiconductor devices on basis of the prepared arrangement information of the unit-device-formation-regions on the masked surface of the wafer with disposing the mask thereon,
   wherein by performing plasma etching processing, the wafer is divided into the respective separate semiconductor devices in accordance with the defined dividing lines.

4. The manufacturing method for semiconductor devices as defined in claim 1, wherein in the determining the arrangement of the unit-device-formation-regions, an arrangement of the respective parallel lines in the device-formation-effective-region is determined so as to maximize a total number of the unit-device-formation-regions in the respective parallel-line-partition-regions.

5. The manufacturing method for semiconductor devices as defined in claim 4, wherein in the determining an arrangement of the unit-device-formation-regions, the disposed parallel lines are rearranged with an offset arrangement, then a total number of the respective unit-device-formation-regions with the rearrangement are calculated, and then an arrangement of the respective unit-device-formation-regions with the arrangement of the respective parallel lines which maximizes the total number is determined as an arrangement of the respective unit-device-formation-regions in the entire device-formation-effective-region.

6. The manufacturing method for semiconductor devices as defined in claim 1, wherein in the case where the semiconductor wafer has an orientation flat, and the device-formation-effective-region has a linear portion corresponding to the orientation flat, the respective parallel lines are disposed in parallel with the linear portion.

7. The manufacturing method for semiconductor devices as defined in claim 1, wherein the respective unit-device-formation-regions are regions having identical dimensions and shape determined based on dimensions and shape of the semiconductor devices and a line width-dimension of dividing lines for dividing the respective semiconductor devices from the semiconductor wafer.

8. The manufacturing method for semiconductor devices as defined in claim 1, wherein a maximum value of formation number of the unit-device-formation-regions in the respective parallel-line-partition-regions is an integer number given by dividing a length-dimension of a shorter line among two parallel lines forming the parallel-line-partition-region by the length-dimension of the first segment.

9. The manufacturing method for semiconductor devices as defined in claim 1, wherein in the determined arrangement of the unit-device-formation-regions, the parallel-line-partition-regions formed to incorporate an odd number of the respective unit-device-formation-regions and the parallel-line-partition-regions formed to incorporate an even number thereof are present in a mixed state.

10. The manufacturing method for semiconductor devices as defined in claim 1, wherein in the determining the arrangement of the unit-device-formation-regions, centering is performed on the arrangement of the respective unit-device-formation-regions in the respective parallel-line-partition-regions with a center position of the parallel-line-partition-regions in a direction along the pertinent parallel lines as a reference.

11. The manufacturing method for semiconductor devices as defined in claim 1, further comprising:
   after performing the plasma etching process, performing an ashing process on the masked surface so as to remove the respective masks on the respective divided semiconductor devices.

12. An arrangement determination method for semiconductor device formation regions, which is a method for determining an arrangement of a plurality of unit-device-formation-regions that are rectangular regions for forming semiconductor devices in a device-formation-effective-region on a semiconductor wafer, the method comprising:
   forming a plurality of parallel-line-partition-regions partitioned by an outer periphery of the device-formation-effective-region on the wafer and a plurality of parallel lines, by disposing the respective parallel lines in the device-formation-effective-region on the wafer with use of a length-dimension of a second-line-segment out of a first-line-segment and the second-line-segment which constitute the unit-device-formation-region and are orthogonal to each other as an arrangement interval, through execution of computer processing;
   forming one or a plurality of the unit-device-formation-regions partitioned by the respective parallel lines and a plurality of the second-line-segments in the parallel-line-partition-regions, by disposing the respective second-line-segments in a direction orthogonal to the parallel lines in the respective parallel-line-partition-regions with use of a length-dimension of the first-line-segment as an arrangement interval, through execution of computer processing; and
   determining an arrangement of the unit-device-formation-regions which maximizes each number of the unit-device-formation-regions formed in each of the respective parallel-line-partition-regions independently of other parallel-line-partition-regions as an arrangement of the respective unit-device-formation-regions in the entire device-formation-effective-region, through execution of computer processing.

13. The arrangement determination method for semiconductor device formation regions as defined in claim 12, wherein region information for the unit-device-formation-regions and the device-formation-effective-region are inputted into a computer, then the respective computer processing is executed with use of the inputted region information, and thereby the determined arrangement is prepared as arrangement information for the unit-device-formation-regions.

14. The arrangement determination method for semiconductor device formation regions as defined in claim 12, wherein in the determining an arrangement of the unit-device-formation-regions, an arrangement of the respective parallel lines in the device-formation-effective-region is determined so as to maximize a total number of the unit-device-formation-regions in the respective parallel-line-partition-regions.

15. The arrangement determination method for semiconductor device formation regions as defined in claim 14, wherein in the determining an arrangement of the unit-device-formation-regions, the disposed parallel lines are rearranged with an offset arrangement, then a total number of the respective unit-device-formation-regions with the rearrangement are calculated, and then an arrangement of the respective unit-device-formation-regions with the arrangement of the respective parallel lines which maximizes the total number is determined as an arrangement of the respective unit-device-formation-regions in the entire device-formation-effective-region.

16. The arrangement determination method for semiconductor device formation regions as defined in claim 12, wherein in the case where the semiconductor wafer has an orientation flat, and the device-formation-effective-region has a linear portion corresponding to the orientation flat, the respective parallel lines are disposed in parallel with the linear portion.

17. The arrangement determination method for semiconductor device formation regions as defined in claim 12, wherein the respective unit-device-formation-regions are regions having identical dimensions and shape determined on the basis of dimensions and shape of the semiconductor devices and a line width-dimension of dividing lines for dividing the respective semiconductor devices from the semiconductor wafer.

18. The arrangement determination method for semiconductor device formation regions as defined in claim 12, wherein a maximum value of formation number of the unit-device-formation-regions in the respective parallel-line-partition-regions is an integer number obtained by dividing a length-dimension of a shorter line among two parallel lines forming the parallel-line-partition-region by the length-dimension of the first segment.

19. The arrangement determination method for semiconductor device formation regions as defined in claim 12, wherein in the device-formation-effective-region, the parallel-line-partition-regions formed to incorporate an odd number of the respective unit-device-formation-regions and the parallel-line-partition-regions formed to incorporate an even number thereof are present in a mixed state.

20. The arrangement determination method for semiconductor device formation regions as defined in claim 12, wherein in the determining the arrangement of the unit-device-formation-regions, centering is performed on the arrangement of the respective unit-device-formation-regions in the respective parallel-line-partition-regions with a center position of the parallel-line-partition-regions in a direction along the pertinent parallel lines as a reference.

21. The arrangement determination method for semiconductor device formation regions as defined in claim 12, which is a method for determining arrangement of the respective unit-device-formation-regions in the semiconductor wafer which is divided into the respective separate semiconductor devices by applying a plasma etching process.

22. An arrangement determination apparatus for semiconductor device formation regions for determining arrangement of a plurality of unit-device-formation-regions that are rectangular regions for forming semiconductor devices in a device-formation-effective-region on a semiconductor wafer, the apparatus comprising:
  a parallel-line-partition-region forming processing unit for forming a plurality of parallel-line-partition-regions partitioned by an outer periphery of the device-formation-effective-region on the wafer and a plurality of respective parallel lines, by disposing the respective parallel lines in the device-formation-effective-region with use of a length-dimension of a second-line-segment out of a first-line-segment and the second-line-segment which constitute the unit-device-formation-region and are orthogonal to each other as an arrangement interval;
  a unit-device-formation-region forming processing unit for forming one or a plurality of the unit-device-formation-regions partitioned by the respective parallel lines and a plurality of the respective second-line-segments in the parallel-line-partition-regions formed by the parallel-line-partition-region forming processing unit, by disposing the respective second-line-segments in a direction orthogonal to the parallel lines in the respective parallel-line-partition-regions with use of a length-dimension of the first-line-segment as an arrangement interval; and
  a unit-device-formation-region arrangement determining processing unit for determining an arrangement of the unit-device-formation-regions which maximizes each number of the unit-device-formation-regions formed by the unit-device-formation-region forming processing unit in each of the respective parallel-line-partition-regions independently of other parallel-line-partition-regions as an arrangement of the respective unit-device-formation-regions in the entire device-formation-effective-region.

23. A program embodied on a computer-readable medium for determining arrangement of semiconductor device formation regions, which makes a computer execute procedures for determining arrangement of a plurality of unit-device-formation-regions which are rectangular regions for forming semiconductor devices in a device-formation-effective-region on a semiconductor wafer, the procedures comprising:
  a first procedure for forming a plurality of parallel-line-partition-regions partitioned by an outer periphery of the device-formation-effective-region and a plurality of parallel lines, by disposing the respective parallel lines in the device-formation-effective-region with use of a length-dimension of a second-line-segment out of a first-line-segment and the second-line-segment which constitute the unit-device-formation-region and are orthogonal to each other as an arrangement interval;
  a second procedure for forming one or a plurality of the unit-device-formation-regions partitioned by the respective parallel lines and a plurality of second-line-segments in the parallel-line-partition-regions, by disposing the respective second-line-segments in a direction orthogonal to the parallel lines in the respective parallel-line-partition-regions formed by the first procedure with use of a length-dimension of the first-line-segment as an arrangement interval; and
  a third procedure for determining an arrangement of the unit-device-formation-regions which maximizes each number of the unit-device-formation-regions formed by the second procedure in each of the respective parallel-line-partition-regions independently of other parallel-line-partition-regions as an arrangement of the respective unit-device-formation-regions in the entire device-formation-effective-region.

24. The program for determining arrangement of the semiconductor device formation regions as defined in claim 23, further comprising:
  a fourth procedure for calculating a total number of the respective unit-device-formation-regions in the respective parallel-line-partition-regions obtained by conduction of the third procedure and determining an arrangement of the respective parallel lines in the entire device-formation-effective-region which maximizes the total number.

* * * * *